United States Patent
Kondo et al.

(10) Patent No.: US 9,915,794 B2
(45) Date of Patent: Mar. 13, 2018

(54) OPTICAL DEVICE, AND OPTICAL-DEVICE PRODUCTION METHOD

(71) Applicant: NGK INSULATORS, LTD., Nagoya (JP)

(72) Inventors: Jungo Kondo, Miyoshi (JP); Shoichiro Yamaguchi, Ichinomiya (JP); Yukihisa Takeuchi, Nagoya (JP)

(73) Assignee: NGK Insulators, Ltd., Nagoya (JP)

( * ) Notice: Subject to any disclaimer, the term of this patent is extended or adjusted under 35 U.S.C. 154(b) by 0 days.

(21) Appl. No.: 15/375,475

(22) Filed: Dec. 12, 2016

(65) Prior Publication Data

US 2017/0299822 A1    Oct. 19, 2017

Related U.S. Application Data

(63) Continuation of application No. PCT/JP2015/065860, filed on Jun. 2, 2015.

(30) Foreign Application Priority Data

Jun. 13, 2014   (JP) ................................. 2014-122161

(51) Int. Cl.
*G02B 6/12* (2006.01)
*G02B 6/42* (2006.01)
(Continued)

(52) U.S. Cl.
CPC ......... *G02B 6/4206* (2013.01); *G02B 6/1228* (2013.01); *G02B 6/136* (2013.01);
(Continued)

(58) Field of Classification Search
CPC .......... G02B 6/43; G02B 6/4214; G02B 6/12; G02B 6/34
See application file for complete search history.

(56) References Cited

U.S. PATENT DOCUMENTS

| 5,500,869 A | 3/1996 | Yoshida et al. |
| 7,061,962 B2 * | 6/2006 | Reithmaier ............... H01S 5/12 372/50.1 |

(Continued)

FOREIGN PATENT DOCUMENTS

| JP | S63-127444 A | 5/1988 |
| JP | H02-195309 A | 8/1990 |

(Continued)

OTHER PUBLICATIONS

U.S. Appl. No. 15/333,487, filed Oct. 25, 2006, Jungo Kondo.

(Continued)

*Primary Examiner* — Jennifer Doan

(74) *Attorney, Agent, or Firm* — Burr & Brown, PLLC

(57) ABSTRACT

An optical device includes a semiconductor laser light source, a grating element and an optical transmission element. The grating element includes a ridge-type optical waveguide having an incident surface to which a semiconductor laser light is incident and an emitting surface from which an outgoing light having a desired wavelength is emitted, and a Bragg grating formed in the ridge-type optical waveguide. The light transmission element includes an optical transmission part having an incident surface to which the outgoing light from the ridge-type optical waveguide is incident. A near-field diameter in a horizontal direction at the incident surface of the optical transmission part is greater than a near-field diameter in the horizontal direction at the emitting surface of said ridge-type optical waveguide.

15 Claims, 22 Drawing Sheets

(51) Int. Cl.
    *G02B 6/122*    (2006.01)
    *G02B 6/136*    (2006.01)
(52) U.S. Cl.
    CPC .............. *G02B 2006/12097* (2013.01); *G02B 2006/12107* (2013.01)

(56) References Cited

U.S. PATENT DOCUMENTS

| | | | | |
|---|---|---|---|---|
| 9,166,130 | B2* | 10/2015 | Feitisch | ............... B23K 20/023 |
| 2008/0291951 | A1 | 11/2008 | Konttinen et al. | |
| 2014/0362886 | A1 | 12/2014 | Kondo et al. | |

FOREIGN PATENT DOCUMENTS

| | | |
|---|---|---|
| JP | H06-334262 A | 12/1994 |
| JP | 2000-082864 A | 3/2000 |
| JP | 2000-332350 A | 11/2000 |
| JP | 2001-091794 A | 4/2001 |
| JP | 2002-134833 A | 5/2002 |
| JP | 2005-301301 A | 10/2005 |
| WO | 2013/034813 A2 | 3/2013 |

OTHER PUBLICATIONS

International Preliminary Report on Patentability and Written Opinion (with English Translation), International Patent Application No. PCT/JP2015/065860, dated Dec. 22, 2016 (12 pages).

Yamada et al. "Highly Accurate Wavelength Control of External Cavity Laser Module with Fiber Grating," IEICE Transactions on Fundamentals of Electronics, Communications and Computer Sciences, C-II vol. J81, No. 7, dated Jul. 1998, pp. 664-665.

Zheng et al. "High-Brightness Narrow-Bandwidth High-Power Laser-Diode Array Based on an External-Cavity Technique," *IEICE Technical Report*, LQE vol. 105, No. 52, dated 2005, pp. 17-20.

Mugino et al. "Output Power Optimization of 980 nm Pump Lasers Wavelength-Locked Using Fiber Bragg Grating," *Furukawa Review*, No. 105, dated Jan. 2000, pp. 24-29.

* cited by examiner

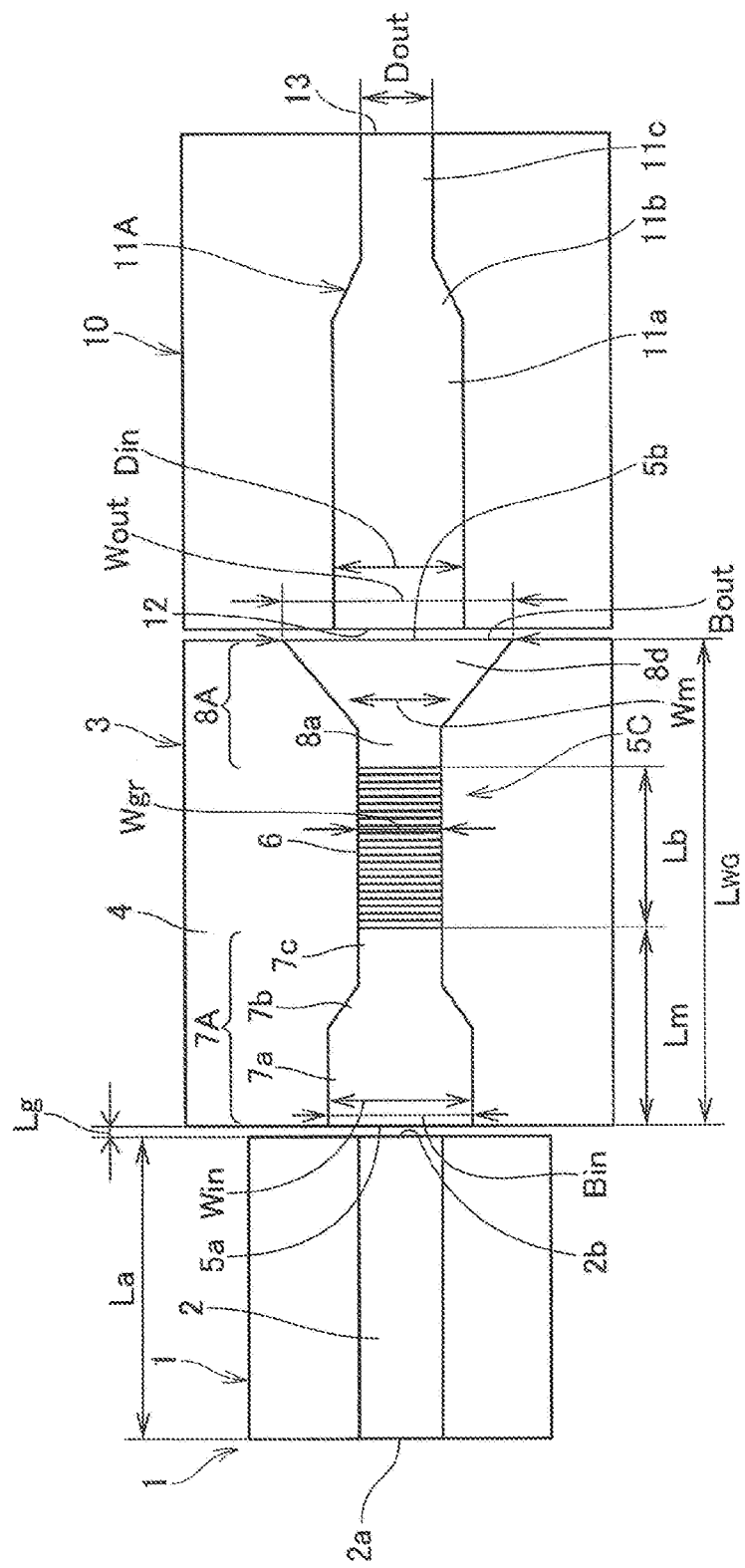

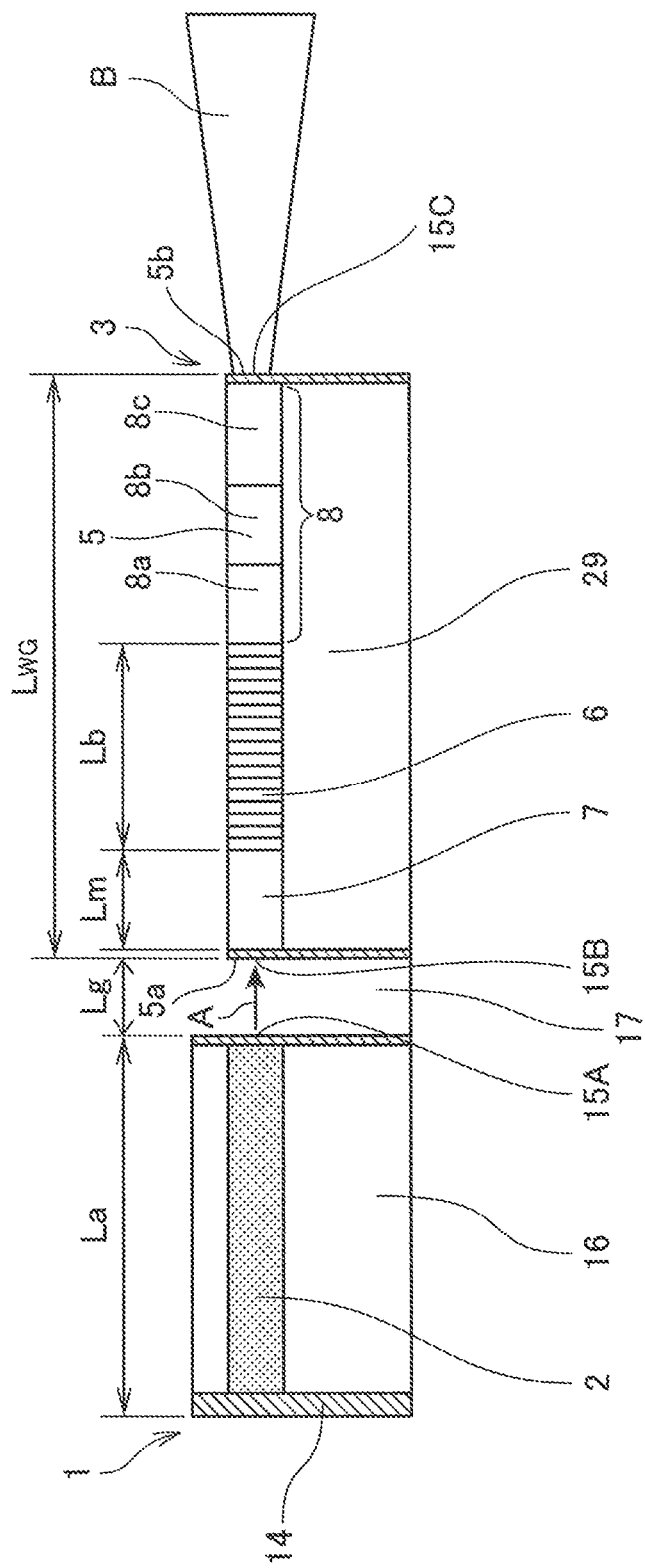

OPTICAL DEVICE, AND OPTICAL-DEVICE PRODUCTION METHOD

TECHNICAL FIELD

The present invention relates to an optical device using a grating element, and a method of manufacturing the optical device.

BACKGROUND ARTS

For semiconductor lasers, there has been used the Fabry-Perot (FP) type, which constitutes an optical resonator sandwiched between mirrors formed on both end surfaces of an active layer. However, the FP type laser oscillates at a wavelength that satisfies the standing wave condition, and thereby tends to operate in a multi-longitudinal mode. Particularly, when current or temperature is changed, the oscillation wavelength varies so that the light intensity is changed.

For this reason, lasers are required to have higher wavelength stability and oscillate in a single mode in applications such as optical communication and gas sensing. To this end, a distributed feedback (DFB) laser and a distributed Bragg reflector (DBR) laser have been developed. These lasers are configured to include a diffraction grating in the semiconductor and to oscillate only at a specific wavelength by making use of the wavelength dependency thereof.

In order to realize a semiconductor laser having the wavelength stability, there may be exemplified a DBR laser and a DFB laser in which a grating is monolithically formed in a semiconductor laser, and an external cavity laser in which a fiber grating (FBG) is attached to the outside of the laser. These lasers are based on the principle that a portion of the laser light is returned to the laser by using a mirror having the wavelength selectivity utilizing the Bragg reflection to achieve a stable wavelength operation.

The DBR laser achieves a resonator by forming concave and convex portions at a waveguide surface on the extension of a waveguide of an active layer by the Bragg reflection. Since this laser is provided with diffraction gratings on the both ends of an optical waveguide layer, a light emitted from the active layer propagates through the optical waveguide layer, whereby a portion thereof is reflected by this diffraction grating and is then returned to a current injection part to be amplified. Since only a light having a specific wavelength is reflected in a predetermined direction from the diffraction grating, the wavelength of the laser light becomes constant.

Moreover, as this application, there have been developed an external cavity type semiconductor laser in which the diffraction grating is a component different from the semiconductor and a resonator is formed outside the semiconductor. The type of the laser results in a laser excellent in the wavelength stability, the temperature stability and the controllability. As the external resonator, there are a fiber Bragg grating (FBG) (non-Patent Document 1), and a volume hologram grating (VHG) (non-Patent Document 2). Since the diffraction grating is constituted as a member different from the semiconductor laser, there is such a feature that the reflectivity and the resonator length can be individually designed. Since it is not subjected to the influence of temperature elevation by heat generation due to current injection, the wavelength stability can be further improved. In addition, the diffraction grating may be designed in conjunction with the resonator length, because the change in the refractive index of the semiconductor depending on the temperature is different from that of the diffraction grating, thereby making it possible to enhance the temperature stability.

Patent Document 1 (Japanese Patent Publication No. 2002-134833A) discloses an external cavity laser utilizing grating formed at a quartz glass waveguide. This aims at providing a laser with the frequency stability, which can be used, without a temperature controller, under an environment where the room temperature greatly changes (e.g. 30° C. or higher). In addition, it describes that there is provided a temperature independent laser in which mode hopping is suppressed and there is no temperature dependency of the oscillation frequency.

As the optical device in which a light emitting device of such external cavity type is further coupled to an optical waveguide element or an optical fiber array, there are three methods described below.

In the method 1, a semiconductor laser incorporated grating element is optically and axially aligned with an optical waveguide element so that they are connected to each other (Patent Document 3).

In the method 2, a semiconductor laser light source and a grating-incorporated optical waveguide element or an optical fiber are coupled so that they are subjected to alignment between them (Patent Document 4, Patent Document 5).

In the method 3, three components of a semiconductor laser light source, a grating element and an optical waveguide element are optically coupled to each other (Patent Document 1).

However, in the method 3, alignment with the sub-micron accuracy is required, and it takes tact so that commercialization thereof is difficult. For this reason, there are proposed techniques to integrate the grating with the semiconductor laser, or the waveguide or the fiber as in the methods 1 and 2.

CITATION LIST

[Patent Document 1] Japanese Patent Publication No. 2002-134833A
[Patent Document 2] US 2014-0362886A1
[Patent Document 3] U.S. Patent Publication No. 2008/0291951A1
[Patent Document 4] WO 2013-034813 A1
[Patent Document 5] Japanese Patent Publication No. 2000-082864A Non-Patent Document Non-Patent Document 1: IEICE Transactions on Fundamentals of Electronics, Communications and Computer Sciences, C-II Vol. J81, No. 7, pp. 664-665, July, 1998.
Non-Patent Document 2: IEICE Technical Report LQE Vol. 105, No. 52, pp. 17-20, 2005.
Non-Patent Document 3: Furukawa Review No. 105, p 24-29, January, 2000.

SUMMARY OF INVENTION

However, in order to allow a semiconductor laser to perform a stable wavelength operation by a grating, it is necessary to uniformly produce the grating having a pitch of several 100 nm in a wafer with the accuracy of 1 nm or less. For forming such a grating pattern, electron beam drawer, a stepper and a nano-imprint device are utilized, but the specifications for warp and irregularities of the wafer surface are rigorous. For this reason, when a Bragg grating is included in the semiconductor laser light source or the optical waveguide, yield of formation of the grating becomes poor by warp or irregularities during the formation of these elements. Further, because fine structures of the elements interfere with each other, and the manufacturing processes interfere with each other, complicated masking is required. From these facts, there is a desire to individually mount three components as in the method 3.

An object of the present invention is, in individually mounting a semiconductor laser light source, a grating element and an optical transmission element, to improve the tolerance for mounting the grating element and the optical transmission element, thereby making it possible to improve the productivity at the time of mounting.

Moreover, an object of the present invention is, in individually mounting a semiconductor laser light source, a grating element and an optical transmission element, to improve the productivity of alignment at the time of mounting the grating element and the optical transmission element.

The present invention provides an optical device comprising a semiconductor laser light source, a grating element and an optical transmission element:
wherein the grating element comprises a ridge-type optical waveguide having an incident surface to which a semiconductor laser light is incident and an emitting surface from which an outgoing light having a desired wavelength is emitted, and a Bragg grating formed in the ridge-type optical waveguide;
wherein the optical transmission element comprises an optical transmission part having an incident surface to which the outgoing light from the ridge-type optical waveguide is incident; and
wherein a near-field diameter in a horizontal direction at the incident surface of the optical transmission part is greater than a near-field diameter in the horizontal direction at the emitting surface of the ridge-type optical waveguide.

Further, the present invention provides an optical device comprising a semiconductor laser light source, a grating element and an optical transmission element:
wherein the grating element comprises a ridge-type optical waveguide having an incident surface to which a semiconductor laser light is incident and an emitting surface from which an outgoing light having a desired wavelength is emitted, and a Bragg grating formed in the ridge-type optical waveguide;
wherein the optical transmission element comprises an optical transmission part having an incident surface to which an outgoing light from the ridge-type optical waveguide is incident; and
wherein the ridge-type optical waveguide comprises an emitting side propagation part between the Bragg grating and the emitting surface, and a width at the emitting surface of the ridge-type optical waveguide is greater than a width in the Bragg grating.

Further, the present invention provides a method of manufacturing an optical device comprising a semiconductor laser light source, a grating element and an optical transmission element:
wherein the grating element comprises a ridge-type optical waveguide having an incident surface to which a semiconductor laser light is incident and an emitting surface from which an outgoing light having a desired wavelength is emitted, and a Bragg grating formed in the ridge-type optical waveguide; and
wherein the optical transmission element comprises an optical transmission part having an incident surface to which an outgoing light from the ridge-type optical waveguide is incident;
the method comprising the steps of:
producing a first base member having a plurality of the optical transmission parts;
producing a second base member having a plurality of the ridge-type optical waveguides;
processing the first base member to form a mounting surface for mounting the second base member thereon;
mounting the second base member onto the mounting surface to obtain a composite body such that the emitting surfaces of the ridge-type optical waveguides are aligned with the incident surfaces of the optical transmission parts; and
cutting the composite body to obtain the optical device.

Further, the present invention provides a method of manufacturing an optical device comprising a semiconductor laser light source, a grating element and an optical transmission element:
wherein the grating element comprises a ridge-type optical waveguide having an incident surface to which a semiconductor laser light is incident and an emitting surface from which an outgoing light having a desired wavelength is emitted, and a Bragg grating formed in the ridge-type optical waveguide; and
wherein the optical transmission element comprises an optical transmission part having an incident surface to which the outgoing light from the ridge-type optical waveguide is incident:
the method comprising the steps of:
producing a first base member having a plurality of the optical transmission parts;
producing a second base member having a plurality of the ridge-type optical waveguides;
bonding the first base member and the second base member to obtain a composite body such that the emitting surfaces of the ridge-type optical waveguides are aligned with the incident surfaces of the optical transmission parts, and
cutting the composite body to obtain the optical device.

In accordance with the present invention, when individually mounting the semiconductor laser light source, the grating element and the optical transmission element, the tolerance at the time of mounting the grating element and the optical transmission element is improved, thereby making it possible to improve the productivity at the time of mounting.

Further, in accordance with the present invention, when individually mounting the semiconductor laser light source, the grating element and the optical transmission element, it is possible to improve the productivity of alignment at the time of mounting the grating element and the optical transmission element.

BRIEF DESCRIPTION OF THE DRAWINGS

FIG. 4 is a plan view schematically showing an optical device.

FIG. 5 is a side view schematically showing a light source and a grating element among the optical device of FIG. 1.

EMBODIMENTS FOR CARRYING OUT THE INVENTION

Figure 1:
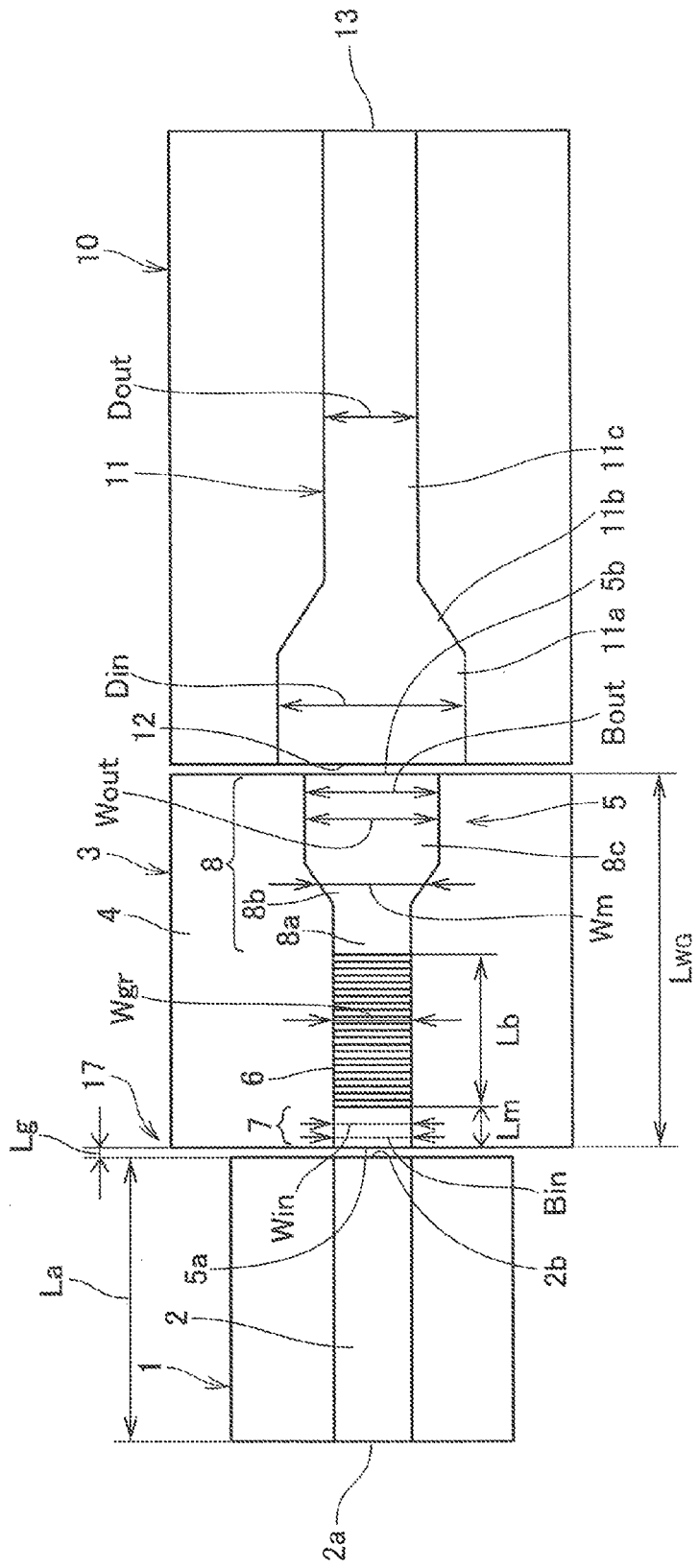
FIG. 1 is a plan view schematically showing an optical device.

An optical device shown, in a model form, in FIGS. 1 and 5 comprises a light source 1 for oscillating a semiconductor laser light, a grating element 3, and an optical transmission element 10. While an optical waveguide element is used as the optical transmission element 10 in this example, an optical waveguide of the optical transmission element may be changed into any optical fiber.

The light source 1 and the grating element 3 may be mounted on a common substrate which is not shown. Moreover, the grating element 3 and the optical transmission element 10 may be mounted on separate substrates which are not shown.

The light source 1 comprises an active layer 2 for oscillating a semiconductor laser light. At an outside end surface 2a of the active layer 2, a reflection film 14 shown in FIG. 5 may be provided. At an end surface on the grating element side of the active layer 2, a non-reflection film or reflection film 15A shown in FIG. 5 may be formed.

At the grating element 3, there is provided a ridge-type optical waveguide 5 including an incident surface 5a to which a semiconductor laser light A is incident, and an emitting surface 5b from which an outgoing light B having a desired wavelength is emitted. A Bragg grating 6 is formed in the optical waveguide 5. Between the incident surface 5a of the optical waveguide 5 and the Bragg grating 6, an incident side propagation part 7 with no diffraction grating is provided, and the incident side propagation part 7 is opposite to the active layer 2 with a gap 17 interposed between them. Non-reflection film or reflection film 15B may be provided on the incident surface 5a side of the optical waveguide 5, and non-reflection film or reflection film 15C may be provided on the emitting surface 5b side.

It is preferable that reflectivities of the non-reflection layers 15A, 15B and 15C are smaller than the grating reflectivity, and it is further preferable that they are 0.1% or less. However, if the reflectivities at the end surfaces are smaller than the grating reflectivity, non-reflection layer may not be provided, and a reflection film may be provided. In this case, the light source 1 can perform laser oscillation by itself.

An oscillation wavelength for the laser light is determined by a wavelength reflected by means of the grating. When light reflected by the grating and light reflected from the end surface on the grating element side of the active layer exceed a gain threshold value of the laser, the oscillation condition is satisfied. Thus, laser light having high wavelength stability can be obtained.

To improve the wavelength stability, the amount of feedback from the grating needs only to be increased, and it is preferable in view of this that the reflectivity of the grating is greater than the reflectivity at the end surface of the active layer 2. Thus, a gain obtained at the resonator by the grating becomes greater than a gain obtained at the cavity of the semiconductor laser, so that the stable laser oscillation can be performed in the resonator with the grating.

In this example, between the emitting surface 5b of the optical waveguide 5 and the Bragg grating 6, there is provided an emitting side propagation part 8 with no diffraction grating. The emitting side propagation part 8 is opposite to an incident surface 12 of an optical waveguide 11 of the optical transmission element 10. Reference numeral 13 denotes an emitting surface of the optical waveguide 11.

In this example, the emitting side propagation part 8 comprises a connecting part 8a continuous from an end of the Bragg grating 6, an emitting part 8c continuous to the emitting surface of the optical waveguide, and a tapered part 8b provided between the connecting part and the emitting part. Moreover, the width $W_{out}$ of the optical waveguide at the emitting surface 5b is greater than the width $W_{gr}$ of the optical waveguide in the Bragg grating 6. Further, the emitting side propagation part 8 includes a tapered part 8b in which the width $W_m$ of the optical waveguide becomes greater from the Bragg grating toward the emitting surface. It is to be noted that, in this example, the width of the optical waveguide at the connecting part 8a is designated as $W_{gr}$ and is constant, and the width $W_{out}$ of the optical waveguide at the emitting part 8c is also constant. In addition, $W_m$ has the minimum value $W_{gr}$ at the boundary with the connecting part 8a, and indicates the maximum value $W_{out}$ at the boundary with the emitting part 8c.

In order to enhance an efficiency of coupling to the semiconductor laser light source, setting is made such that the width $W_{gr}$ of the optical waveguide in the Bragg grating is equivalent to the near-field pattern of the laser. There are instances where the size in the horizontal direction of the near-field of the semiconductor laser may be, e.g., 2 µm to 7 µm. In this case, the width $W_{gr}$ of the optical waveguide is set to 2 µm to 7 µm.

In this embodiment, by relatively increasing the optical waveguide width $W_{out}$ at the emitting surface of the emitting side propagation part, it is possible to increase the near-field diameter (horizontal direction) $B_{out}$ of the mode field of light beam at the emitting surface can be increased. As a result, it is possible to lower the density of the light beam emitted from the grating element thus to improve tolerance of the size in the horizontal direction when such outgoing light is coupled to the optical transmission element. Thus, the productivity in optically incorporating the grating element and the optical transmission element is remarkably improved.

In this example, the near-field diameter (horizontal direction ($D_{in}$) of the mode field pattern at the incident surface 12 of the optical transmission part, e.g., the optical waveguide 11 of the optical transmission element is greater than the near-field diameter (horizontal direction) $B_{out}$ of the mode field of the light beam at the emitting surface of the optical waveguide 5. Thus, the tolerance for the optical axis deviation at the time of alignment is further improved.

It is to be noted that in the case where the near-field diameter $D_{in}$ at an incident part 11a of the optical transmission part 11 is increased to improve the tolerance for the optical axis deviation at the time of alignment, there are instances where the near-field diameter emitted from the optical transmission element to the outside may be too great. In this case, as in this example, an emitting part 11c having a smaller near-field diameter $D_{out}$ may be provided. In this case, it is preferable, from a viewpoint of reduction in loss, to provide, between the incident part 11a and the emitting part 11c, a tapered part 11b in which the near-filed diameter gradually becomes smaller.

Figure 2:
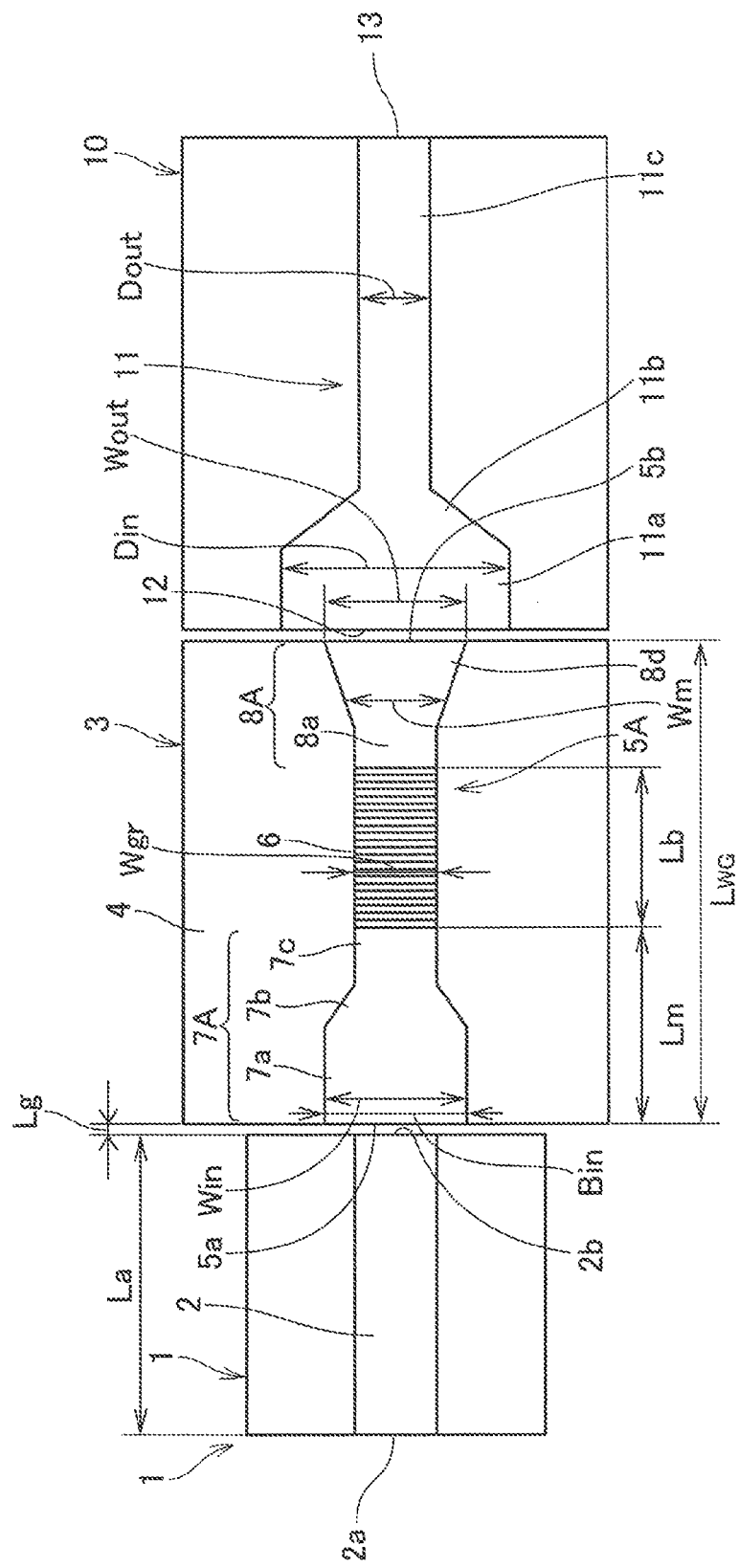
FIG. 2 is a plan view schematically showing an optical device.

The optical device of FIG. 2 is substantially similar to the optical device of FIG. 1, but includes a ridge-type optical waveguide 5A having a form different from that of the ridge-type optical waveguide of FIG. 1.

Namely, the Bragg grating 6 is formed in the optical waveguide 5A. Between the incident surface 5a of the optical waveguide 5A and the Bragg grating 6, there is provided an incident side propagation part 7A with no diffraction grating, and the incident side propagation unit 7A is opposite to the active layer 2 with a gap 17 interposed between them. Between the emitting surface 5b of the optical waveguide 5 and the Bragg grating 6, there is provided an emitting side propagation part 8A with no diffraction grating. The emitting side propagation part 8A is opposite to the incident surface 12 of the optical waveguide 11 of the optical transmission element 10.

In this example, the emitting side propagation part 8A comprises a connecting part 8a continuous from the end of the Bragg grating 6, and an emitting part 8d continuous to the emitting surface of the optical waveguide. Moreover, the width $W_{out}$ at the emitting surface 5b is greater than the width $W_{gr}$ in the Bragg grating 6 of the optical waveguide. Further, at the emitting part 8d, the width $W_m$ of the optical waveguide becomes greater from the Bragg grating toward the emitting surface. In this example, the width of the optical waveguide at the connecting part 8a is designated as $W_{gr}$, and is constant. $W_m$ has the minimum value $W_{gr}$ at the boundary with the connecting part 8a, and has the maximum value $W_{out}$ at the emitting surface.

In this embodiment, the optical waveguide width $W_{out}$ at the emitting surface 5b of the emitting side propagation part is relatively increased to thereby increase the near-field diameter (horizontal direction) $B_{out}$ of the mode field of the light beam at the emitting surface. Simultaneously, the near-field diameter (horizontal direction) $D_{in}$ of the mode field pattern at the incident surface 12 of the optical transmission part, e.g., the optical waveguide 11 of the optical transmission element is greater than the near-field diameter (horizontal direction) $B_{out}$ of the mode field of the light beam at the emitting surface.

Moreover, in this example, the incident side propagation part 7A comprises a connecting part 7c continuous from the end of the Bragg grating 6, an incident part 7a opposite to the light source, and a tapered part 7b provided between the connecting part and the incident part. Moreover, the width $W_{in}$ of the optical waveguide at the incident surface 5a is greater than the width $W_{gr}$ of the optical waveguide in the Bragg grating 6. Further, at the tapered part 7b, the width of the optical waveguide gradually becomes smaller from the incident part 7a toward the connecting part 7c.

By the incident side propagation part of such a structure, it is possible to improve tolerance for the optical axis deviation at the time of alignment between the active layer of the light source and the incident surface 5a of the grating element while securing the single mode propagation in the Bragg grating.

Figure 3:
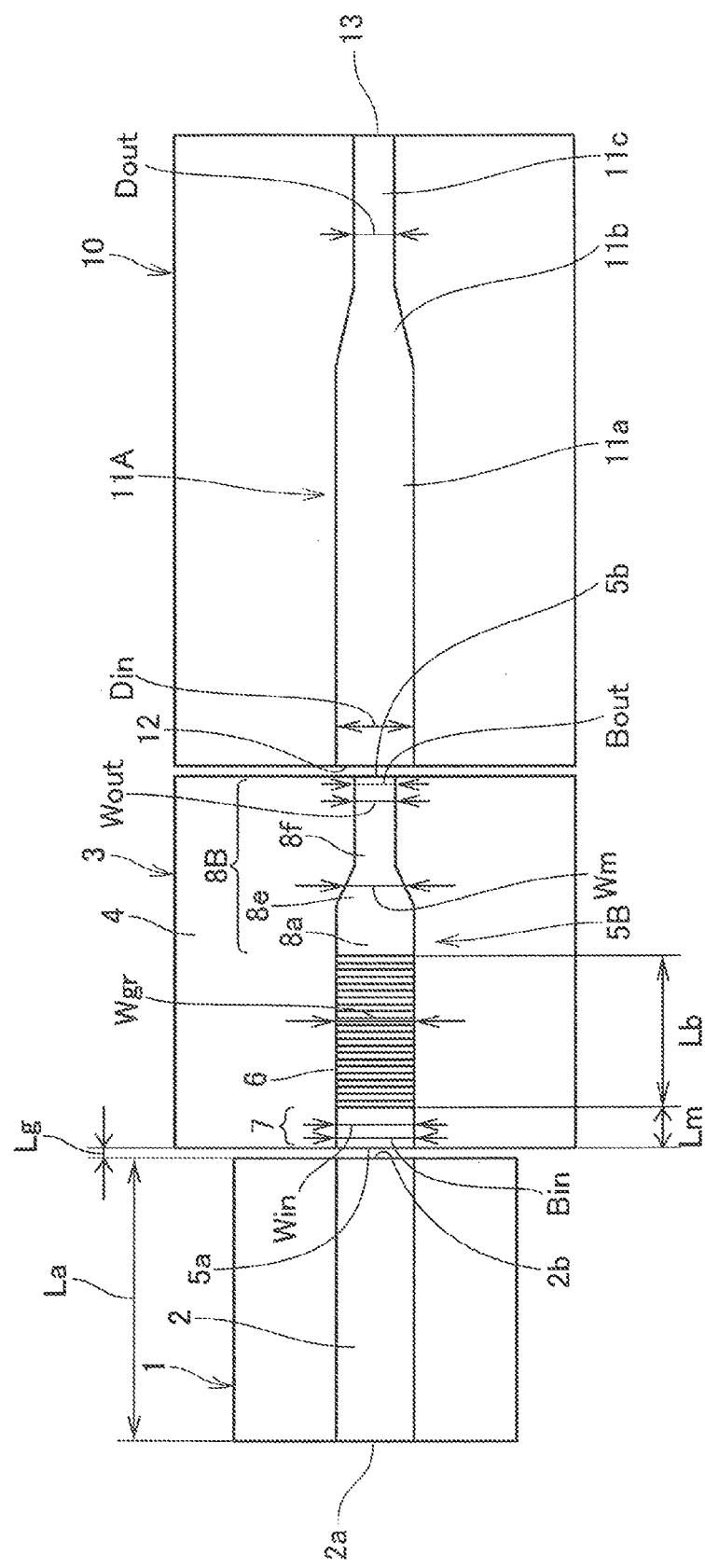
FIG. 3 is a plan view schematically showing an optical device.

The optical device of FIG. 3 is substantially similar to the optical device of FIG. 1, but includes a ridge-type optical waveguide 5B and the optical transmission part 11A that have the different forms from the ridge-type optical waveguide and the optical transmission part of FIG. 1.

Namely, the Bragg grating 6 is formed in the optical waveguide 5B. Between the incident surface 5a of the optical waveguide 5 and the Bragg grating 6, there is provided the incident side propagation part 7 with no diffraction grating. Between the emitting surface 5b of the optical waveguide 5 and the Bragg grating 6, there is provided an emitting side propagation part 8B with no diffraction grating.

In this example, the emitting side propagation part 8B comprises a connecting part 8a continuous from the end of the Bragg grating 6, an emitting part 8f having the emitting surface 5b, and a connecting part 8e between the connecting part 8a and the emitting part 8f. Moreover, the width $W_{out}$ of the optical waveguide at the emitting surface 5b is smaller than the width $W_{gr}$ of the optical waveguide in the Bragg grating 6. Further, in the tapered part 8e, the width $W_m$ of the optical waveguide gradually becomes smaller from the Bragg grating toward the emitting surface. In this example, the width of the optical waveguide at the connecting part 8a is designated as $W_{gr}$, and is constant. $W_m$ has the maximum value $W_{gr}$ at the boundary with the connecting part 8a, and has the minimum value $W_{out}$ at the boundary with the emitting part 8f.

Moreover, in this example, the near-field diameter (horizontal direction) $D_{in}$ of the mode field pattern at the incident surface 12 of the optical transmission part 11A of the optical transmission element is allowed to be greater than the near-field diameter (horizontal direction) $B_{out}$ of the mode field of the light beam at the emitting surface of the optical waveguide 5B. Thus, tolerance for the optical axis deviation at the time of alignment is further improved. Further, an emitting part 11c having a smaller near-field diameter $D_{out}$ may be provided. In this case, it is preferable in view of reduction in loss to provide, between the incident part 11a and the emitting part 11c, a tapered part 11b in which the near-field diameter gradually becomes smaller.

The optical device of FIG. 4 is similar to the device shown in FIG. 1, but includes the incident side propagation part 7A and the emitting side propagation part 8A that have the different forms from the incident side propagation part and the emitting side propagation part of FIG. 1. The form of the incident side propagation part 7A is the same as that of the part shown in FIG. 2. The form of the emitting side propagation part 8A is the same as that of the part shown in FIG. 2.

Moreover, the form of the optical transmission part 11A of the optical transmission element 10 is similar to that shown in FIG. 3. In this example, the near-field diameter (horizontal direction) $D_{in}$ of the mode field pattern at the incident surface 12 of the optical transmission part 11A of the optical transmission element is smaller than the near-field diameter (horizontal direction) $B_{out}$ of the mode field of the light beam at the emitting surface of an optical waveguide 5C. However, also in this case, when $B_{out}$ is sufficiently increased, it is possible to improve the tolerance for the optical axis deviation at the time of alignment.

The cross sectional structure of the ridge-type optical waveguide will be exemplified below.

Figure 6A:
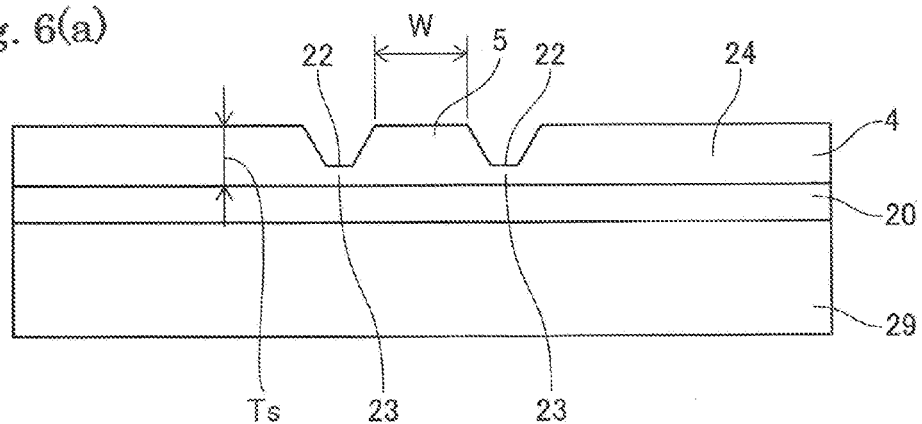
FIGS. 6(a), 6(b) and 6(c) are cross sectional views schematically showing the grating elements, respectively.

In the example shown in FIG. 6(a), an optical material layer 4 is formed on a substrate 29 with a lower buffer layer 20 interposed between them. For example, a pair of ridge grooves 22 are formed in the optical material layer 4, and ridge-type optical waveguide 5 is formed between the ridge grooves. The lower buffer layer 20 and the atmosphere function as a clad. In this case, the Bragg grating may be formed on the flat surface side of the optical material layer, or may be formed on the ridge groove side. In view of reducing variations in shape of the Bragg grating and the ridge groove, it is preferable to form the Bragg grating on the flat surface side to thereby provide the Bragg grating and the ridge grooves on the opposites of the optical material layer.

Also in this example, the atmosphere can be directly in contact with the grating. Thus, refractive index difference can be increased depending upon whether the grating groove is present or absent, resulting in that the reflectivity can be increased by the short length of the grating.

Figure 6B:
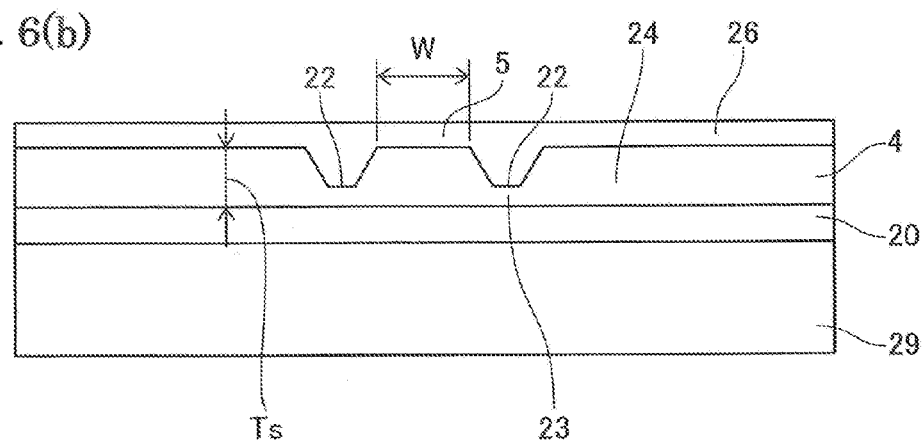

In the example of FIG. 6(b), an upper buffer layer 26 functioning as a clad is formed on the optical material layer 4.

Figure 6C:
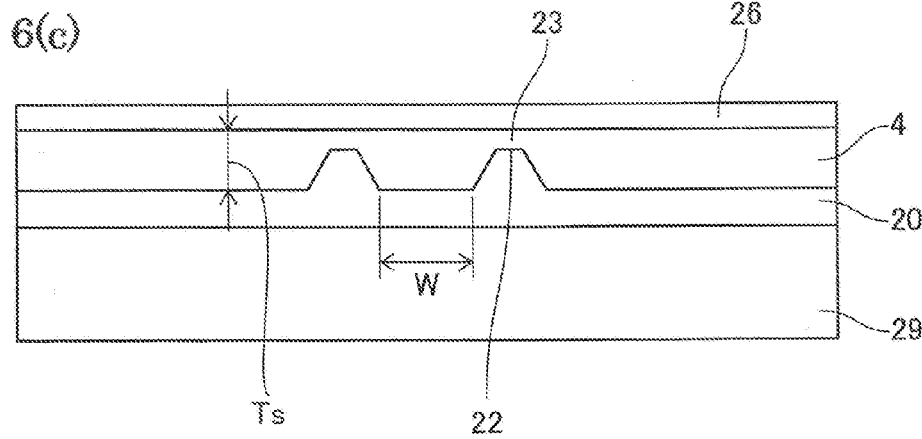

Moreover, in the example of FIG. 6(c), an optical material layer 4 is formed on a substrate 29 with the lower buffer layer 20 interposed between them. For example, a pair of ridge grooves 22 are formed in the optical material layer 4, and a ridge-type optical waveguide 5 is formed between the ridge grooves. In this example, the ridge grooves 22 are formed on the lower buffer layer side. In addition, the upper buffer layer 26 is formed on the optical material layer 4.

An adhesive layer may be provided between the lower buffer layer and the substrate.

In a preferred embodiment, the ridge-type optical waveguide includes a core made of an optical material, wherein the core is surrounded by the clad. The cross section (cross section in a direction perpendicular to the propagation direction of light) has the convex shape.

The convex shape means that a line segment connecting any two points on the contour of the cross section of the core is positioned inside the contour of the cross section of the core. The convex shape is a general geometrical term. As such a shape, there are exemplified polygons such as a triangle, a square, a hexagon, an octagon, a circle, and an ellipse, etc. As a square, particularly a square having an upper side, a lower side, and a pair of side surfaces is preferable, and a trapezoid is particularly preferable.

Figure 7A:
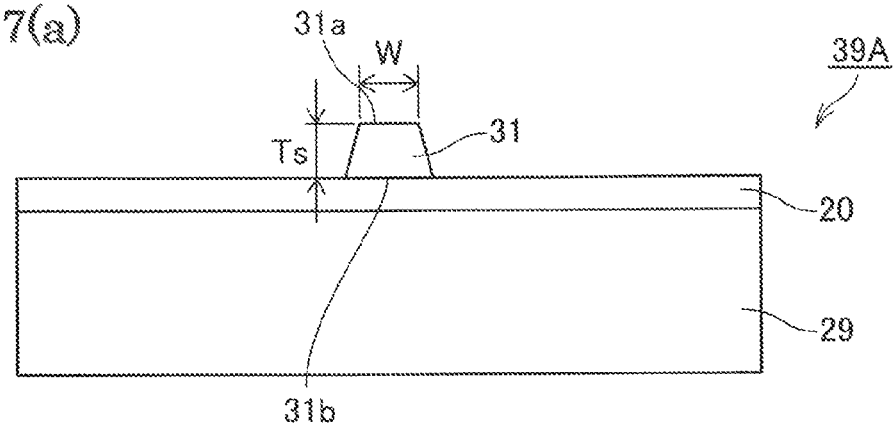
FIGS. 7(a), 7(b) and 7(c) are model views showing cross sectional shapes of the grating elements, respectively.

For example, in an element 39A shown in FIG. 7(a), an optical waveguide 31 including a core made of the optical material is formed on a substrate 29 with a lower buffer layer 20 interposed between them. On the lower side of the optical waveguide 31, there exists a lower buffer layer 20 functioning as a clad. An upper buffer layer is not provided on the side surfaces and the upper surface of the optical waveguide 31. For this reason, the side surfaces and the upper surface of the optical waveguide 31 are exposed to the atmosphere, and the atmosphere functions as a clad. The optical waveguide 31 is trapezoidal in cross section, and an upper surface 31a is narrower than a lower surface 31b. Additionally, an adhesive layer may be formed between the buffer layer 20 and the supporting substrate 29.

Figure 7B:
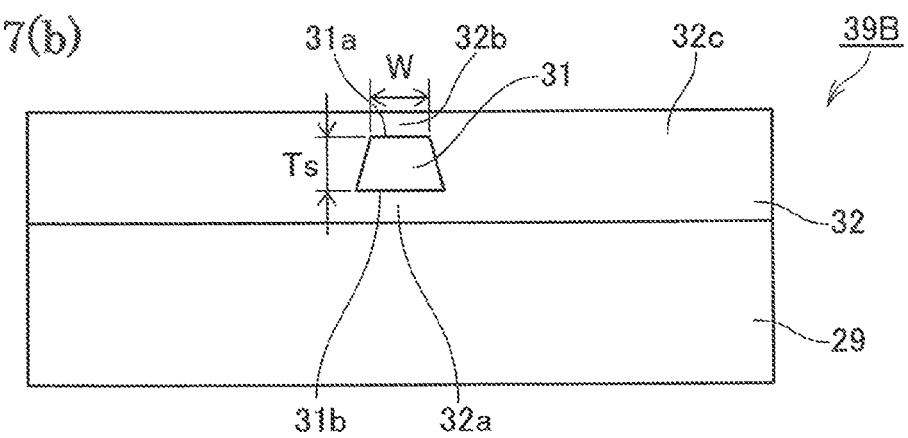

In an element 39B shown in FIG. 7(b), a buffer layer 32 is provided on a substrate 29, and an optical waveguide 31 including a core made of the optical material is embedded in the buffer layer 32. The buffer layer 32 includes an upper surface covering part 32b for covering the upper surface of the optical waveguide, a side surface covering part 32c for covering the side surfaces of the optical waveguide, and a bottom surface covering part 32a for covering the bottom surface of the optical waveguide.

Figure 7C:
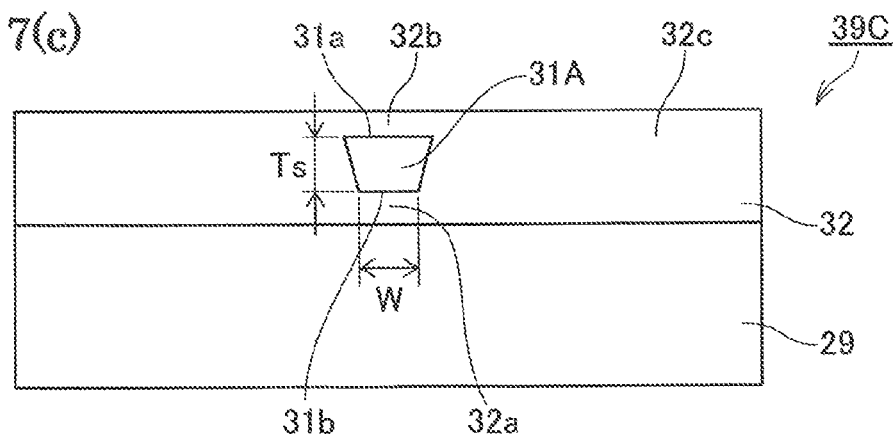

In an element 39C shown in FIG. 7(c), a buffer layer 32 is provided on the substrate 29, and an optical waveguide 31A including a core made of the optical material is embedded in the buffer layer 32. The buffer layer 32 includes an upper surface covering part 32b for covering the upper surface of the optical waveguide, side surface covering parts 32c for covering the side surfaces of the optical waveguide, and a bottom surface covering part 32a for covering the bottom surface of the optical waveguide.

Figure 8A:
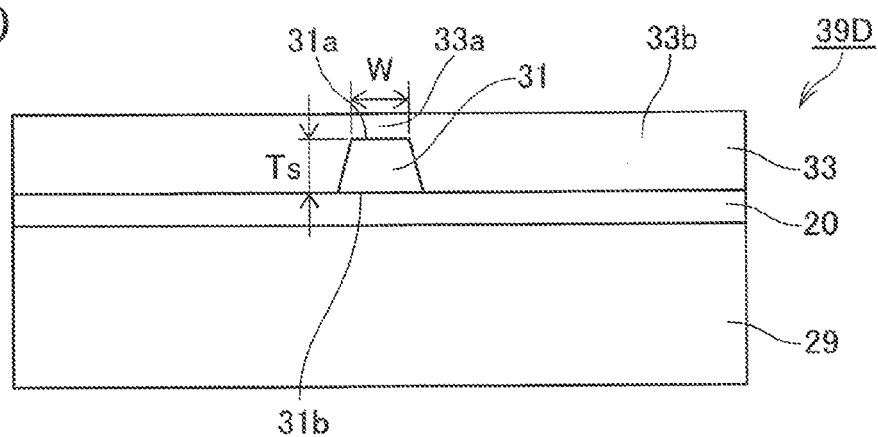
FIGS. 8(a) and 8(b) are model views showing cross sectional shapes of the grating elements, respectively.

Moreover, in an element 39D shown in FIG. 8(a), an optical waveguide 31 including a core made of the optical material is formed on the substrate 29 with the lower buffer layer 20 interposed between them. An upper buffer layer 33 functioning also as a clad is formed on the side surfaces and the upper surface 31a of the optical waveguide 31 to cover the optical waveguide 31. The upper buffer layer 33 includes side surface covering parts 31b for covering the side surfaces of the optical waveguide 31, and an upper covering part 31a for covering the upper surface thereof.

Figure 8B:
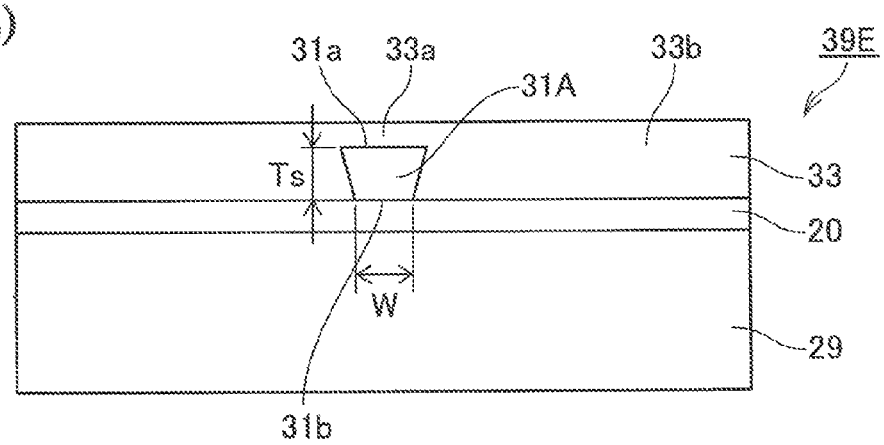

Further, in an element 39E shown in FIG. 8(b), an optical waveguide 31A including a core made of the optical material is formed. The optical waveguide 31A is trapezoidal in cross section, and the lower surface thereof is narrower than the upper surface thereof. The upper clad layer 33 includes the side surface covering parts 33b for covering the side surfaces of the optical waveguide 31A, and an upper surface covering part 33a for covering the upper surface thereof.

In addition, as shown in FIGS. 6 to 8, for example, the width W of the optical waveguide means a minimum value of the width of the optical waveguide in the cross section. When the shape of the optical waveguide is a trapezoidal shape in which the upper surface thereof is narrower, the width W of the optical waveguide is the width of the upper surface. When the shape of the optical waveguide is a trapezoidal shape in which the lower surface is narrower, the width W of the optical waveguide is the width of the lower surface. Further, W includes $W_{in}$, $W_{out}$, and $W_{gr}$. $T_s$ is the thickness of the optical waveguide (layer).

As a light source, a laser made of GaAs based or InP based material having high reliability is preferred. When oscillating green laser, which is the second harmonic, utilizing, e.g., non-linear optical element as application of the structure according to this application, a laser of the GaAs based laser oscillating near a wavelength of 1064 nm may be used. Since the GaAs based or InP based laser has a high reliability, it is possible to realize a light source such as a laser array arranged in one dimensional form, etc. A super luminescent diode or a semiconductor optical amplifier (SOA) may be employed. In addition, the material and/or wavelength of the active layer may be selected as occasion demands.

Additionally, a method of performing power stabilization by combination of a semiconductor laser and a grating element is disclosed as below:
(Non-Patent Document 3: Furukawa Review, pp 24-29, No. 105, January, 2000)

The ridge-type optical waveguide is obtained by physically performing processing through, e.g., cutting processing by a peripheral cutting edge or through laser abrasion processing, etc., and by performing forming process.

The Bragg grating may be formed by physical or chemical etching in a manner as described below.

As a specific example, a metallic film such as Ni or Ti is formed on a high refractive index substrate to periodically form windows by means of photolithography, thereby forming a mask for etching. Thereafter, periodical grating grooves are formed by means of a dry etching device such as reactive ion etching. Finally, the metallic mask is removed so thin the Bragg grating can be formed.

In order to further improve the optical damage resistance of the optical waveguide, the optical waveguide may contain one or more kinds of metal elements selected from a group consisting of magnesium (Mg), zinc (Zn), scandium (Sc) and indium (In). In this case, magnesium is particularly preferable. Moreover, a rare earth element may be contained in the crystal as a doping component. As the rare earth element, Nd, Er, Tm, Ho, Dy, and Pr are particularly preferable.

The material of the adhesive layer may be an inorganic adhesive or may be an organic adhesive, or may be a combination of the inorganic adhesive and the organic adhesive.

Moreover, the optical material layer 4 may be deposited and formed by a thin film formation process onto a supporting substrate. As such thin film formation process, sputtering, vapor deposition and CVD may be exemplified. In this case, the optical material layer 4 is directly formed on the supporting substrate, but the above-described adhesive layer does not exist.

The specific material of the supporting substrate is not particularly limited, and there may be exemplified lithium niobate, lithium tantalate, glass such as quartz glass, crystal and Si, etc.

It is required that the reflectivity of the non-reflection layer is equal to or lower than a grating reflectivity. As a material suitable for use in deposition of the non-reflection layer, there may be used a laminated film made of oxides such as silicon dioxide, tantalum pentoxide, magnesium fluoride, and calcium fluoride, and metals.

Further, respective end surfaces of the light source element and the grating element may be obliquely cut for the purpose of suppressing end surface reflection. In addition, the grating element may fixed by adhesion or directly bonded with the supporting substrate, or may be formed by deposition on the supporting substrate.

From the viewpoint of the present invention, it is preferable that the width $W_{out}$ of the optical waveguide at the emitting surface is 5 μm or more, it is further preferable that it is 7 μm or more, and it is most preferable that it is 10 μm or more. Moreover, it is preferable that $W_{out}$ is 20 μm or less. Further, it is preferable that $W_{out}/W_{gr}$ is 1.6 or more, and it is further preferable that it is 2.5 or more. On the other hand, it is preferable that $W_{out}/W_{gr}$ is 7 or less.

From the viewpoint of the present invention, it is preferable that the near-field diameter (horizontal direction) $B_{out}$ at the emitting surface is 5 μm or more, and it is further preferable that it is 7 μm or more, and it is most preferable that it is 10 μm or more. Moreover, it is preferable that $B_{out}$ is 20 μm or less.

From the viewpoint of the present invention, it is preferable that the near-field diameter (horizontal direction) $D_{in}$ in the optical transmission part is 5 μm or more, and it is further preferable that it is 7 μm or more.

From a viewpoint of coupling the outgoing light from the grating element to the optical transmission element 10, it is preferable that $D_{in}/W_{out}$ is 1.1 or more, and it is further preferable that it is 1.2 or more.

On the other hand, as shown in FIG. 4, for example, in an embodiment in which the optical waveguide width $W_{out}$ at the emitting surface 5b of the emitting side propagation part 8A is greater than the optical waveguide width $W_{gr}$ in the Bragg grating, it is preferable that $D_{in}/W_{out}$ is 0.9 or less, and it is further preferable that it is 0.83 or more.

From the viewpoint of the present invention, the greater near-field diameter (vertical direction) at the emitting surface of the grating element is preferable, and it is thus preferable that it is 0.5 μm or more, and it is further preferable that it is 1 μm or more. Moreover, it is preferable that the near-field diameter (vertical direction) at the emitting surface of the grating element is 5 μm or less.

From the viewpoint of the present invention, it is preferable that the near-field diameter (vertical direction) in the optical transmission part is 0.1 μm or more, and it is further preferable that it is 0.5 μm or more. It is preferable that the near-field diameter (vertical direction) in the optical transmission part/the near-field diameter (vertical direction) at the emitting surface of the grating element is 1.1 or more, and it is further preferable that it is 1.2 or more.

The near-field diameters in the horizontal direction and in the vertical direction of the laser light will be measured in a manner described below.

When a light intensity distribution of the laser light is measured, the width at the light intensity of 1/e2 (e is the base of the natural logarithm: 2.71828) with respect to the maximum value (ordinarily corresponding to the central portion of the core) is defined as the near-field diameter in general. In the case of the laser light, since the near-field is different in size between the horizontal and vertical directions of the laser element, they are individually defined. In the case of a concentric circle, like the optical fiber, they are respectively defined as a diameter thereof.

For measurement of the light intensity distribution, generally, light intensity distribution of the spots of the laser light can be obtained by the beam profile measurement utilizing a near-infrared camera or the light intensity measurement by means of a knife-edge.

In view of improving tolerance for the positional deviation at the time of optical axis alignment between the light source and the grating element, it is preferable that the near-field diameter (horizontal direction) Bin at the incident surface of the ridge-type optical waveguide of the grating element is 4 μm or more, and it is further preferable that it is 6 μm or more.

In view of coupling to the semiconductor laser, it is preferable that the width $W_{gr}$ of the optical waveguide in the Bragg grating is 2 μm or more, and it is further preferable that it is 2.5 μm or more. Moreover, from the similar reason, it is preferable that the width $W_{gr}$ of the optical waveguide in the Bragg grating is 7 μm or less, and it is more preferable that it is 6.5 μm or less.

In order to improve the tolerance for coupling to the semiconductor laser, a taper structure is provided in an input part of the optical waveguide of the grating element, thereby making it possible to broaden the width in the incident part of the optical waveguide. In this case, even if the optical waveguide width in the grating portion is further reduced, it is possible to maintain the efficiency of coupling to the light source. Accordingly, in view of the single propagation mode, the width $W_{gr}$ of the optical waveguide in the Bragg grating may be 1 µm or more. By doing so, the wavelength stability is improved thus to have ability to improve the power stability.

The optical transmission element may be an optical waveguide element, or may be an optical fiber array. Such an optical transmission element may be harmonic wave generating element such as the second harmonic generating element, and may be an optical control element such as a light modulating element, a polarization element, a light amplifier, an optical delay element and an optical memory.

A preferred embodiment of the device according to the present invention will now be described in more detail.

In regard to the grating element, generally, in the case where a fiber grating is used, since quartz has a small temperature coefficient of refractive index, $d\lambda_G/dT$ is small, and $|d\lambda_G/dT - d\lambda_{TM}/dT|$ becomes greater. For this reason, there is a tendency such that the temperature range $\Delta T$ where mode hopping takes place would be small.

For this reason, in a preferred embodiment, there may be used a material having the refractive index of the waveguide substrate at which grating is formed is 1.7 or more, or is preferably 1.8 or more. Thus, since the temperature coefficient of the refractive index can be increased, and $d\lambda_G/dT$ can be also increased, $|d\lambda_G/dT - d\lambda_{TM}/dT|$ can be reduced, thus enabling the temperature range $\Delta T$ where mode hopping takes place to be broad.

Further, in a preferred embodiment, with this being as the premise, contrary to the common sense of the person skilled in the art, setting is made such that the full width at half maximum $\Delta\lambda_G$ at the peak of the Bragg reflectivity is a relatively greater value. Thereafter, in order to allow the mode hopping to become difficult to take place, it is necessary to increase a wavelength interval (longitudinal mode interval) which satisfies a phase condition. For this reason, it is necessary to shorten the cavity length. Accordingly, the length Lb of the Bragg grating is decreased to 300 µm or less.

Thereafter, the depth td of the concave and convex portions constituting the Bragg grating is not less than 20 nm nor more than 250 nm, whereby $\Delta\lambda_G$ can be not less than 0.8 nm nor more than 6 nm. Thus, the number of longitudinal modes in the range of this $\Delta\lambda_G$ can be adjusted to be in a range from 2 to 5. Namely, when wavelengths which satisfy the phase condition are discrete, and the number of longitudinal modes in the range of $\Delta\lambda_G$ is not less than 2 nor more than 5, the mode hopping repeatedly occurs in $\Delta\lambda_G$, and does not deviate from that range. For this reason, no great mode hopping takes place. Accordingly, the wavelength stability can be enhanced to suppress optical power variations.

Figure 12:
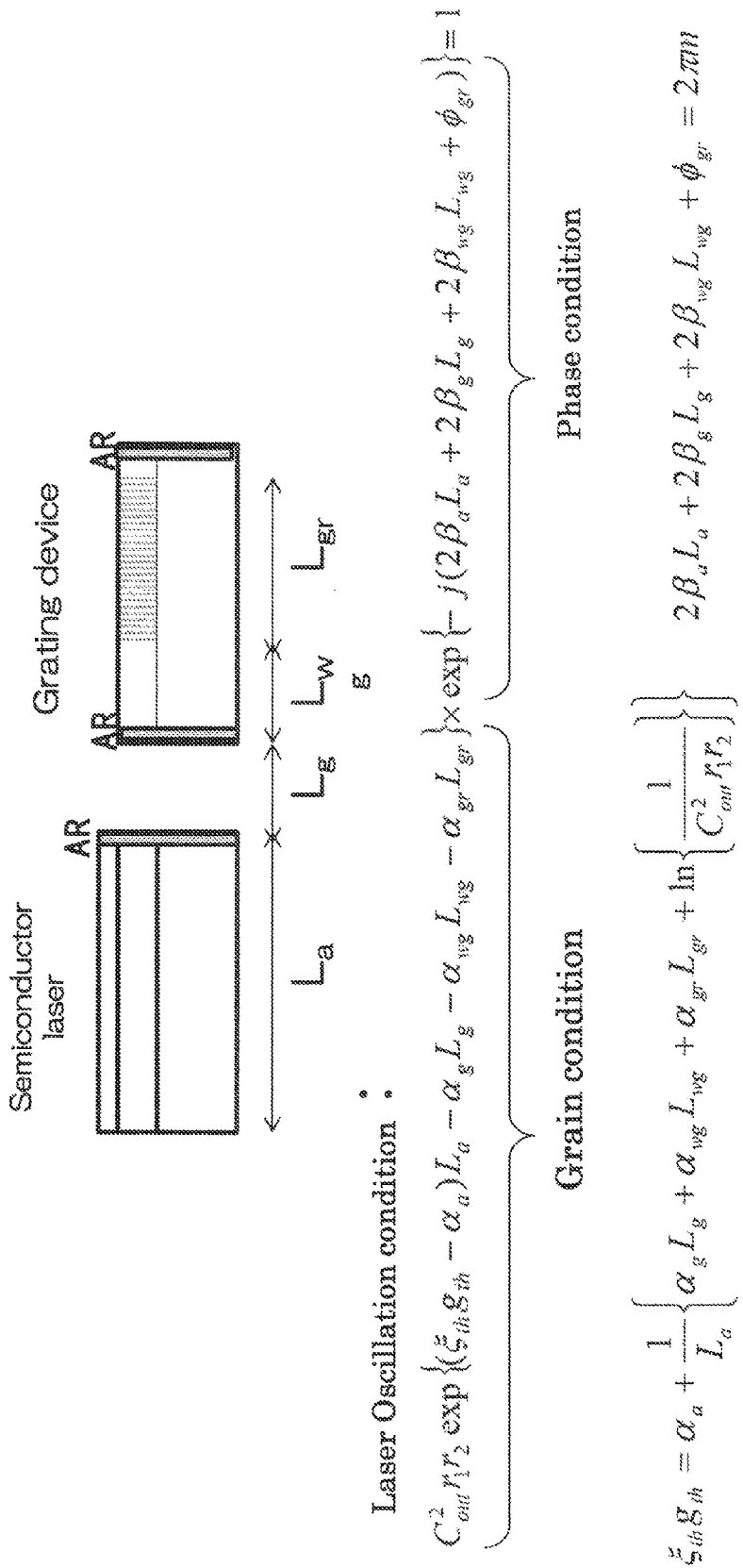
FIG. 12 is a conceptual diagram for explaining a laser oscillation condition in a preferred embodiment.

The meaning of the condition in this embodiment in the configuration as shown in FIG. 12 will now be described in more detail.

It should be noted that because the numerical expressions are metaphysical and are therefore difficult to understand, comparison between a typical embodiment of the prior art and this embodiment is directly made in the beginning, and the features of this embodiment will be described. It is assumed that conditions in this embodiment will be subsequently described.

First, the oscillation condition for the semiconductor laser is determined by the product of the gain condition and the phase condition as in the following formula.

$$(C_{out}^2)^4 |r_1||r_2| \exp\{(\xi_t g_{th} - \alpha_a)L_a - \alpha_b L_b\} \times \exp\{j(-\phi_1 - \phi_2 - 2\beta L_a)\} = 1 \quad \text{Formula (2-1)}$$

The gain condition is given as the following formula from the formula (2-1).

$$\xi_t g_{th} = \alpha_a L_a + \alpha_b L_b + \frac{1}{L_a} \ln\left(\frac{1}{|r_1||r_2|C_{out}^2}\right) \quad \text{Formula (2-2)}$$

In the above formula, $\alpha_a$, $\alpha_g$, $\alpha_{wg}$, $\alpha_{gr}$ are loss coefficients of the active layer, the gap between the semiconductor laser and the waveguide, the grating unprocessed waveguide part on the input side, and the grating part, respectively; $L_a$, $L_g$, $L_{wg}$, $L_{gr}$ are lengths of the active layer, the gap between the semiconductor laser and the waveguide, the grating unprocessed waveguide part on the input side, and the grating part, respectively; r1 and r2 are mirror reflectivities (r2 is reflectivity of the grating); $C_{out}$ is a coupling loss between the grating element and the light source; $\xi_t g_{th}$ is a gain threshold value of laser medium; $\phi_1$ is a phase change based on the laser side reflection mirror; and $\phi_2$ is a phase change in the grating part.

It is indicated from the formula (2-2) that when the gain $\xi_t g_{th}$ (gain threshold value) of the laser medium exceeds a loss, laser oscillation will take place. A gain curve (wavelength dependency) of the laser medium has a full width at half maximum of 50 nm or more, and has the broad characteristics. Moreover, since the loss part (the right side) has hardly the wavelength dependency except for the reflectivity of the grating, the gain condition is determined by the grating. For this reason, the gain condition can be considered only by the grating in the comparison table.

On the other hand, the phase condition is expressed as indicated by the following formula from the formula (2-1). In this case, $\phi$1 is zero.

$$\phi_2 + 2\beta L_a = 2p\pi \text{ (}p \text{ represents an integer)} \quad \text{Formula (2-3)}$$

Figure 9:
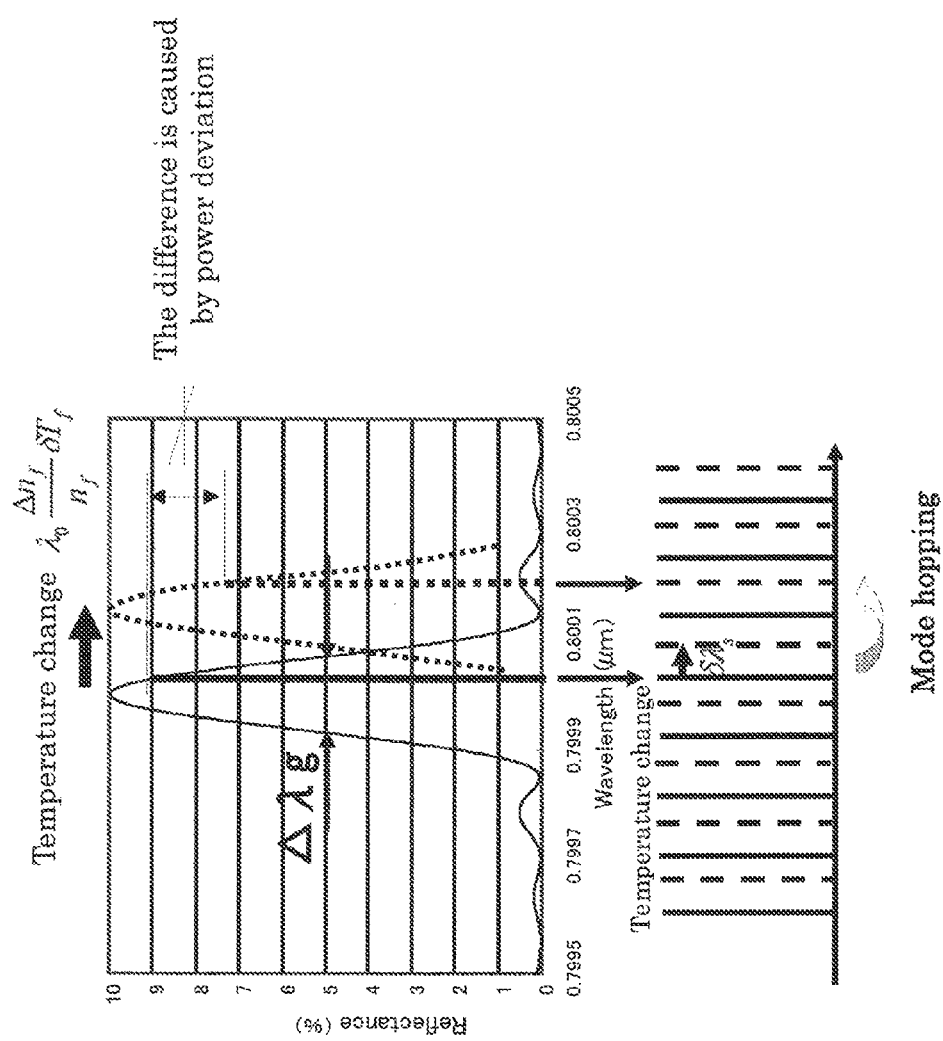
FIG. 9 is a diagram for explaining a form of mode hopping according to a prior art.
Figure 10:
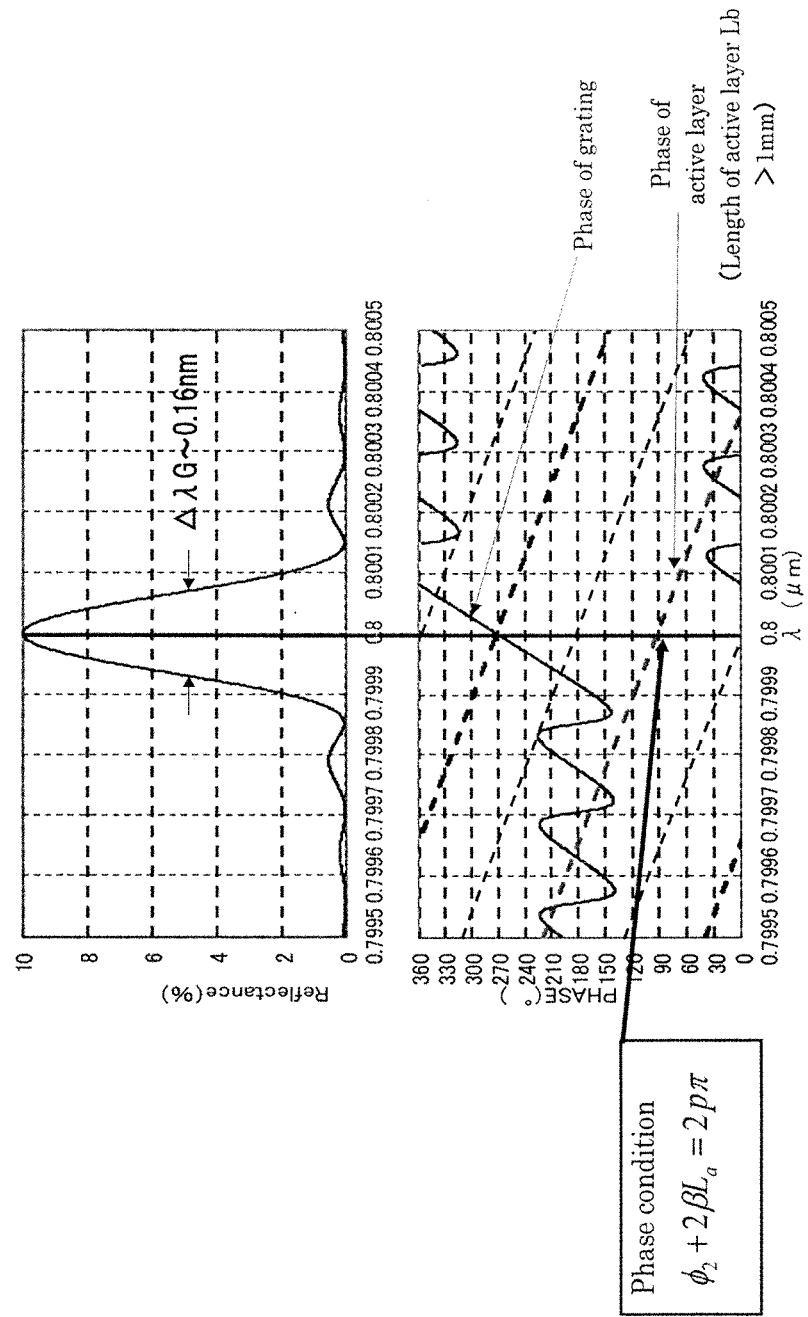
FIG. 10 is a diagram for explaining a form of mode hopping according to a prior art.

For the external cavity type laser, an external cavity using the quartz based glass waveguide and FBG are commercialized. In accordance with the conventional design concept, as shown in FIGS. 9 and 10, the reflection characteristics of the grating are set to satisfy $\Delta\lambda_G$=approximately 0.2 nm and a reflectivity of 10%. From this fact, the length of the grating part is 1 mm. On the other hand, wavelengths which satisfy the phase condition become discrete, and the number of the wavelengths satisfying the formula (2-3) is set to be two to three in $\Delta\lambda_G$. For this reason, the laser medium having an active layer with a greater length is required, and the active layer having 1 mm or more is used.

In the case of the glass waveguide or FBG, the temperature dependency of $\lambda_G$ is very small, and results in $d\lambda_G/dT$=about 0.01 nm/° C. From this fact, the external cavity type laser has the feature that the wavelength stability is high.

However, as compared to this, the temperature dependency of the wavelength which satisfies the phase condition is great as indicated by $d\lambda_G/dT$=0.05 nm/° C., whereby a difference between them is 0.04 nm/° C.

In general, a temperature $T_{mh}$ in which mode hopping occurs can be considered as indicated by the following formula from the non-Patent Document 1 (Consideration is made under the condition of Ta=Tf).

ΔG$_{TM}$ is a wavelength interval (longitudinal mode interval) which satisfies the phase condition of the external cavity laser.

$$T_{mh} = \frac{\Delta G_{TM}}{\left|\frac{d\lambda_G}{dT} - \frac{d\lambda_{TM}}{dT}\right|} \quad \text{Formula (2-4)}$$

From this, in the case of the prior art, $T_{mh}$ is approximately 5° C. For this reason, mode hopping is likely to take place. Accordingly, when such a mode hopping has taken place, the power would be varied on the basis of the reflection characteristics of the grating, thereby resulting in variations of 5% or more.

From the above, in an actual operation, the conventional external cavity-type laser utilizing glass waveguide or FBG has carried out the temperature control utilizing the Peltier element.

On the contrary, in this embodiment, as a prior condition, there is used a grating element that makes the denominator of the formula (2-4) small. It is preferable that the denominator of the formula (2-4) is 0.03 nm/° C. or less, and gallium arsenide (GaAs), lithium niobate (LN), lithium tantalate (LT), oxide tantalite (Ta$_2$O$_5$), zinc oxide (ZnO), and alumina oxide (Al$_2$O$_3$) are preferred as a specific material for the optical layer.

It has been found that when five or less wavelengths which satisfy the phase condition exist in Δλ$_G$, even if mode hopping takes place, the operation can be performed under a stable laser oscillation condition.

Namely, in this embodiment, for example, when a polarized light in the z-axis of lithium niobate is used, the oscillation wavelength changes at 0.1 nm/° C. relative to the change in temperature on the basis of the temperature characteristics of the grating. In this case, even if the mode hopping takes place, power variations can be unlikely to take place. In the structure according to this application, the grating length Lb is, e.g., 100 μm in order to increase Δλ$_G$, and La is, e.g., 250 μm in order to increase ΔG$_{TM}$.

Further, the difference from Patent Document 1 will be also supplemented.

This application has a premise to allow the temperature coefficient of the grating wavelength and the temperature coefficient of the gain curve of the semiconductor laser to close to each other. From this, it is assumed to use a material having a refractive index of 1.7 or more (preferably 1.8 or more). Further, it is assumed that the groove depth td of the grating is not less than 20 nm nor more than 250 nm; that the reflectivity is not less than 3% nor more than 60%, and its full width at half maximum Δλ$_G$ is not less than 0.8 nm nor more than 250 nm. From these, the resonator structure can become compact, and temperature independency can be realized without adding any element. In Patent Document 1, respective parameters are described as below, and all fall in the prior art.

Δλ$_G$=0.4 nm
Longitudinal mode interval ΔG$_{TM}$=0.2 nm
Grating length Lb=3 mm
LD active layer length La=600 μm
Length of the propagation part=1.5 mm Respective conditions will be more specifically described below:

$$0.8 \text{ nm} \leq \Delta\lambda_G \leq 6.0 \text{ nm} \quad (1)$$

$$10 \text{ μm} \leq L_b \leq 300 \text{ μm} \quad (2)$$

$$20 \text{ nm} \leq td \leq 250 \text{ nm} \quad (3)$$

$$nb \geq 1.7 \quad (4)$$

It is assumed that, in the above formula (4), the refractive index $n_b$ of material constituting the Bragg grating is 1.7 or more.

While a material having a lower refractive index such as quartz was conventionally typical, the refractive index of the material constituting the Bragg grating is higher in the idea of the present invention. This is because a material having higher refractive index significantly changes its refractive index depending on the temperature to increase $T_{mh}$ of the formula (2-4) and further to increase the temperature coefficient dλ$_G$/dT of the grating as previously described. From the viewpoint, it is preferable that $n_b$ is 1.8 or more, and it is further preferable that it is 1.9 or more. In addition, although there is particularly no upper limit of $n_b$, because a grating pitch becomes too small so that formation becomes difficult, it is preferable that it is 4 or less.

The full width at half maximum Δλ$_G$ at the peak of the Bragg reflectivity is 0.8 nm or more (Formula (1)). λ$_G$ is the Bragg wavelength. Namely, as shown in FIGS. 9 and 10, when the abscissa represents a reflection wavelength based on the Bragg grating, and the ordinate represents the reflectivity, a wavelength where the reflectivity becomes maximum is the Bragg wavelength. Moreover, a difference between two wavelengths where reflectivity becomes one half of the peak at a peak with the Bragg wavelength as a center is referred to as the full width at half maximum Δλ$_G$.

The full width at half maximum Δλ$_G$ at the peak of the Bragg reflectivity is 0.8 nm or more (the formula (1)). This serves to allow the peak of the reflectivity to be broad. From a viewpoint of this, it is preferable that the full width at half maximum Δλ$_G$ is 1.2 nm or more, and it is further preferable that it is 1.5 nm or more. Further, the full width at half maximum Δλ$_G$ is 6 nm or less, but it is further preferable that it is 3 nm or less, and it is further preferable that it is 2 nm or less.

When a plurality of gratings having periods different from each other are formed, it is preferable that the synthesized full width at half maximum Δλ$_{Gn}$ of the reflection characteristics of the gratings is 20 nm or less.

The length L$_b$ of the Bragg grating is 300 m or less (the formula 2). The length L$_b$ of the Bragg grating is a grating length in a direction of an axis of light propagating through the optical waveguide. Decreasing the length L$_b$ of the Bragg grating to 300 μm or less, which is smaller than in the prior art, is considered as a precondition of the design idea in this embodiment. Namely, for the purpose of allowing the mode hopping to be unlikely to occur, it is necessary to increase the wavelength interval (longitudinal mode interval) which satisfies the phase condition. To realize this, it is necessary to shorten the cavity length and to shorten the length of the grating element. From a viewpoint of this, it is further preferable that the length L$_b$ of the Bragg grating is 200 μm or less.

Shortening the length of the grating element leads to reduction in loss so that the threshold value of the laser oscillation can be reduced. As a result, driving can be performed by low current, low heat generation and low energy.

Moreover, in order to obtain a reflectivity of 3% or more, it is preferable that the length L$_b$ of the grating is 5 μm or more, and it is further preferable that it is 10 μm or more to obtain the reflectivity of 5% or more.

In the formula (3), td is the depth of irregularities (convex and concave portions) constituting the Bragg grating. When 20 nm≤td≤250 nm is satisfied, $\Delta\lambda_G$ is not less than 0.8 nm nor more than 250 nm. Thus, the number of the longitudinal modes in $\Delta\lambda_G$ can be adjusted to be not less than 2 nor more than 5. From such a viewpoint, it is further preferable that td is 30 nm or more, and it is further preferable that it is 200 nm or less. To allow the full width at half maximum to be 3 nm or less, td is preferably 150 nm or less.

In a preferred embodiment, in order to promote the laser oscillation, it is preferable to make a setting such that the reflectivity of the grating element is 3% or more, and is 40% or less. It is further preferable, for further stabilizing the output power, that this reflectivity is 5% or more, and it is further preferable, for increasing the output power, that it is 25% or less.

Figure 11:
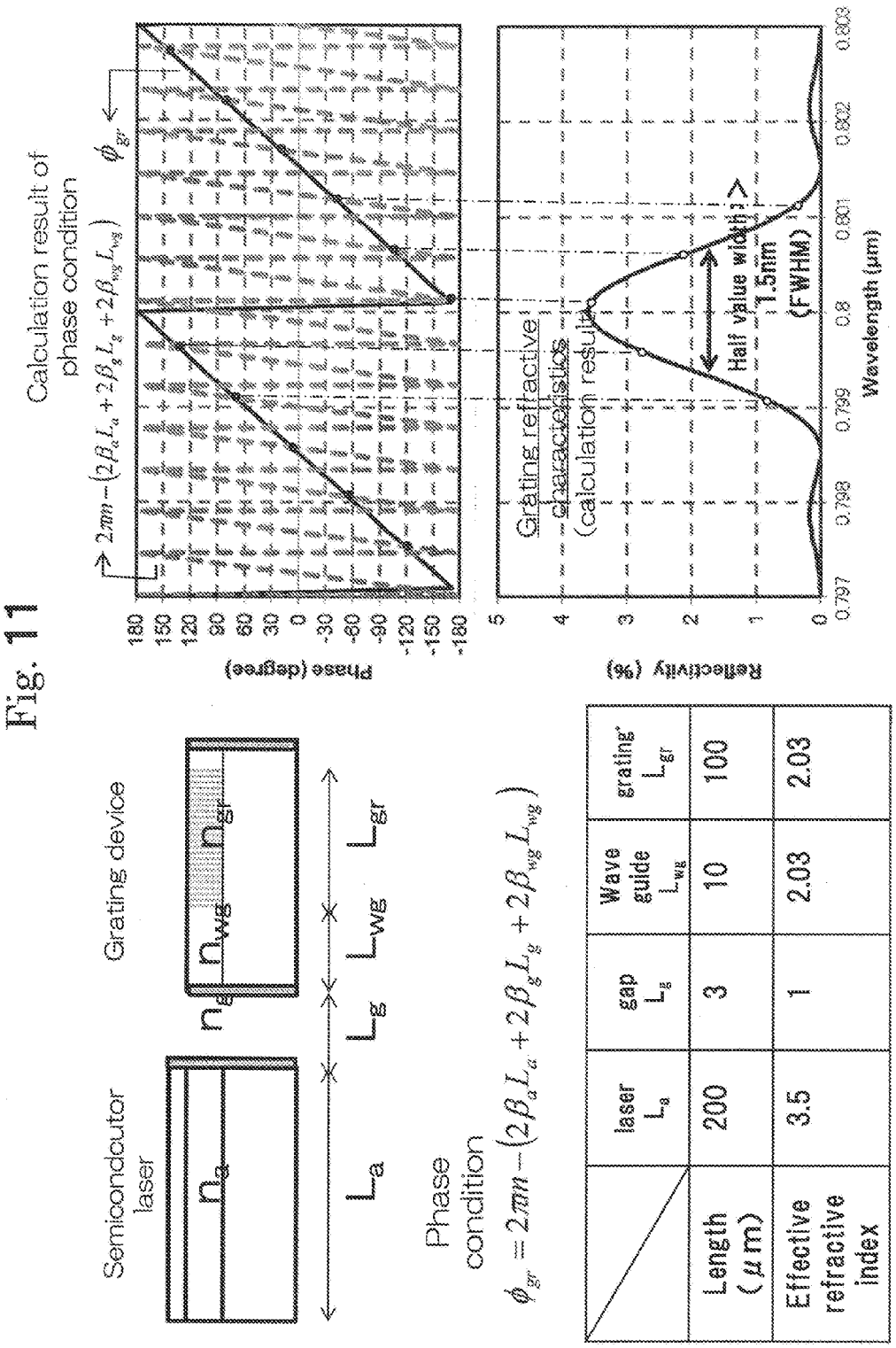
FIG. 11 shows an example of a discrete phase condition in a preferred embodiment.

The laser oscillation condition is configured by the gain condition and the phase condition as illustrated in FIG. 12. The wavelengths which satisfy the phase condition are discrete, and is in FIG. 11, for example. Namely, in this structure, the temperature coefficient of the gain curve (in the case of GaAs, 0.3 nm/° C.) and the temperature coefficient $d\lambda_G/dT$ of the grating are caused to be close to each other, thereby making it possible to fix the oscillation wavelength in $\Delta\lambda_G$. Further, when the number of longitudinal modes in $\Delta\lambda_G$ is not less than 2 nor more than 5, oscillation wavelength shows repeatedly mode hopping in $\Delta\lambda_G$, whereby the probability where laser oscillation takes place outside $\Delta\lambda_G$ can be reduced. Therefore, significant mode hop does not take place, and the operation can be performed in the state where the wavelength is stable and the output power is also stable.

In a preferred embodiment, the length $L_a$ of the active layer is also 500 μm or less. From the viewpoint of this, it is further preferable that the length $L_a$ of the active layer is 300 μm or less. Moreover, in viewpoint of increasing the output of the laser, it is preferable the length $L_a$ of the active layer is 150 μm or more.

$$\left| \frac{d\lambda_G}{dT} - \frac{d\lambda_{TM}}{dT} \right| \leq 0.03 \text{ nm/° C.} \tag{6}$$

In the formula (6), $d\lambda_G/dT$ is a temperature coefficient of the Bragg wavelength.

Moreover, $d\lambda_{TM}/dT$ is a temperature coefficient of the wavelength which satisfies the phase condition of the external cavity laser.

In this case, $\lambda_{TM}$ is a wavelength which satisfies the phase condition of the external cavity laser, i.e., is a wavelength which satisfies the phase condition of the previously described formula (2-3). This will be referred to as the "longitudinal mode" in this specification.

The longitudinal mode will now be further described.

β is expressed as $\beta = 2\pi n \text{ eff}/\lambda$ in the formula (2.3), wherein neff is an effective refractive index therein, and λ which satisfies this condition is designated as $\lambda_{TM}$. ϕ2 is a phase change in the Bragg grating.

$\Delta G_{TM}$ is a wavelength interval (longitudinal mode interval) which satisfies the phase condition of the external cavity laser. Since there exist a plurality of the wavelengths $\lambda_{TM}$, $\Delta G_{TM}$ means respective differences between the wavelengths $\lambda_{TM}$.

Accordingly, the formula (6) is satisfied to thereby elevate a temperature at which mode hopping takes place, thus making it possible to suppress the mode hopping in fact. It is further preferable that the numerical value of the formula (6) is 0.025 or less.

In a preferred embodiment, the length $L_{WG}$ of the grating element is also 600 m or less. It is preferable that $L_{WG}$ is 400 μm or less, and it is further preferable that it is 300 μm or less. Moreover, it is preferable that $L_{WG}$ is 50 μm or more.

In a preferred embodiment, a distance $L_g$ between the emitting surface of the light source and the incident surface of the optical waveguide is not less than 1 μm nor more than 10 μm. Thus, stable oscillation becomes possible. Additionally, the incident side propagation part may not be provided.

Then, a method of manufacturing the optical device will now be described in more detail.

Figure 13A:
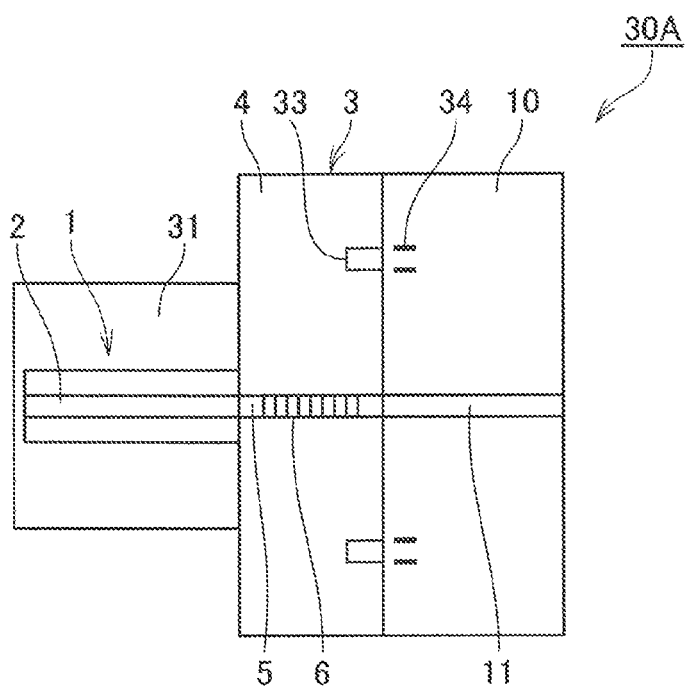
FIG. 13(a) is a plan view schematically showing an optical device 30A of a preferred example.
Figure 13B:
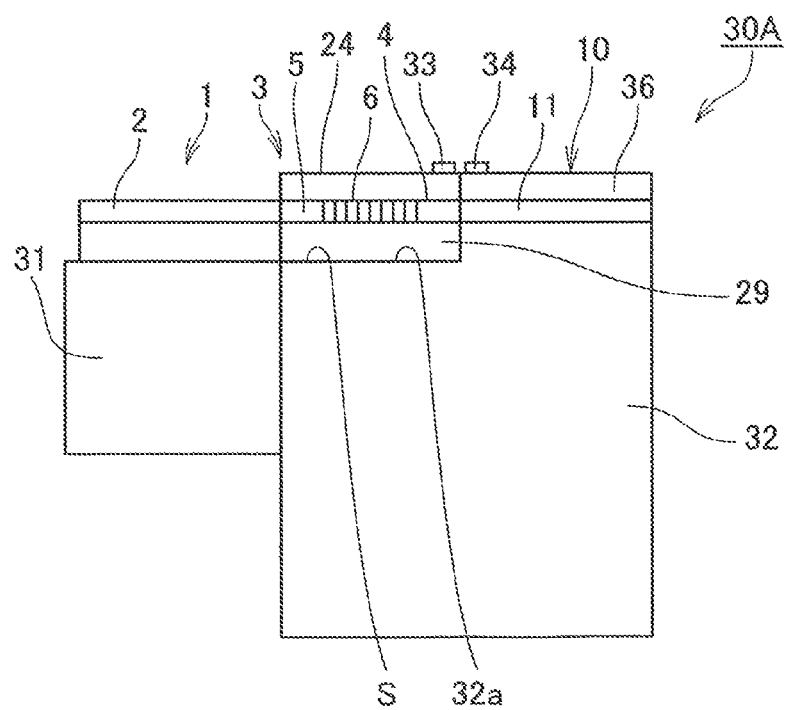
FIG. 13(b) is a side view schematically showing the optical device 30A.

In a preferred embodiment, there is provided a common substrate for mounting the grating element and the optical transmission element thereon. The device of FIG. 13 relates to this embodiment. FIG. 13(a) is a plan view showing, in a model form, a device 30A, and FIG. 13(b) is a side view showing the device 30A.

A light source 1 is mounted on a mounting substrate 31. Moreover, an optical transmission element 10 is mounted on a separate mounting substrate 32. Along with them, a step part S and a mounting surface 32a are formed by processing at the mounting substrate 32, and a grating element 3 is mounted on the mounting surface 32a. The mounting substrate 31 and the mounting substrate 32 are integrated by means of adhesion or soldering, etc. Reference numerals 24, 36 denote an upper buffer layer.

Figure 14A:
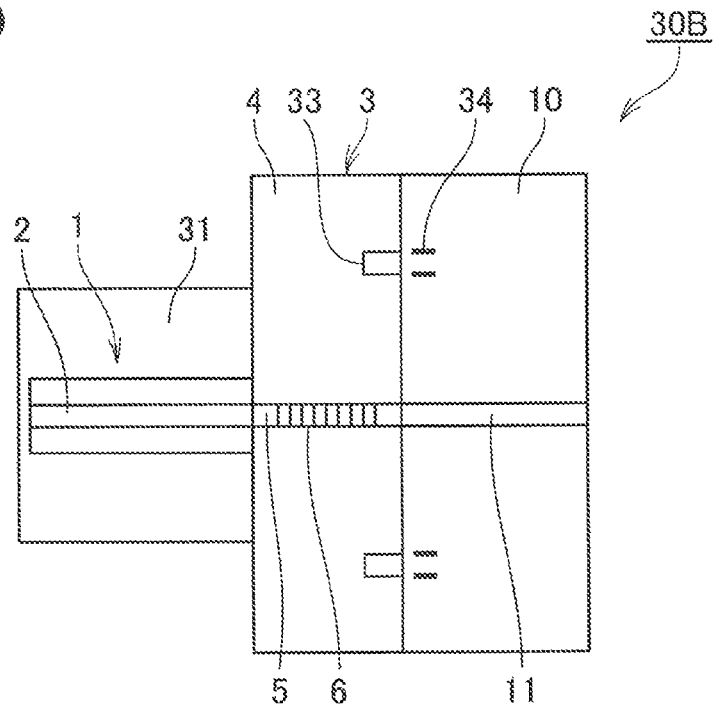
FIG. 14(a) is a plan view schematically showing an optical device 30B of a preferred example.
Figure 14B:
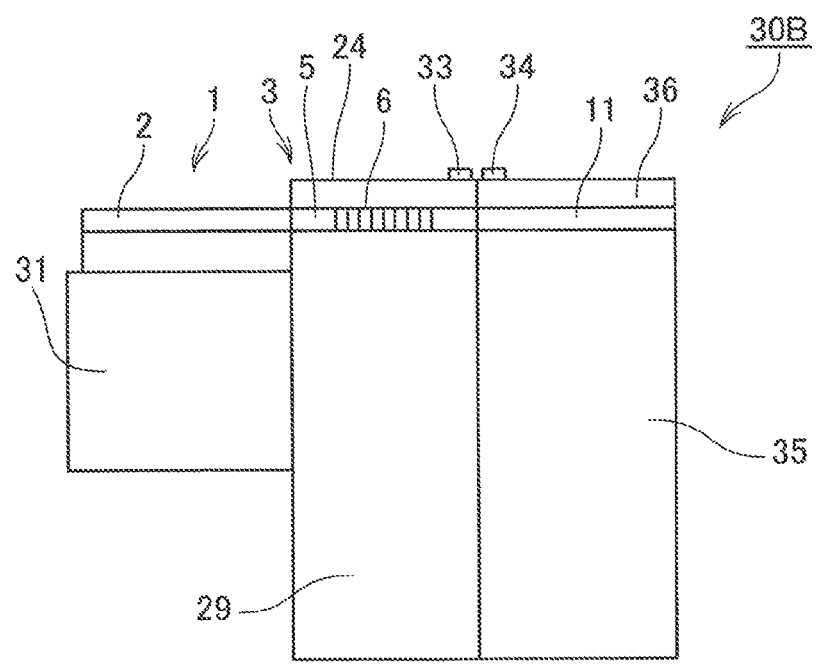
FIG. 14(b) is a side view schematically showing the optical device 30B.

Moreover, in a preferred embodiment, the substrate for mounting the grating element and the substrate for mounting the optical transmission element are separate bodies. The device of FIG. 14 relates to this embodiment. FIG. 14(a) is a plan view showing, in a model form, device 30B, and FIG. 14(b) is a side view showing the device 30B.

The light source 1 is mounted on the mounting substrate 31. Moreover, the optical transmission element 10 is mounted on a separate mounting substrate 35. Along with them, the grating element 3 is mounted on a separate mounting substrate 29. The mounting substrate 29 in this example also serves as a supporting substrate. The mounting substrate 31 and the mounting substrate 29 are integrated by means of adhesion or soldering, etc., and the mounting substrates 29 and 35 are integrated by means of adhesion, etc.

Figure 15A:
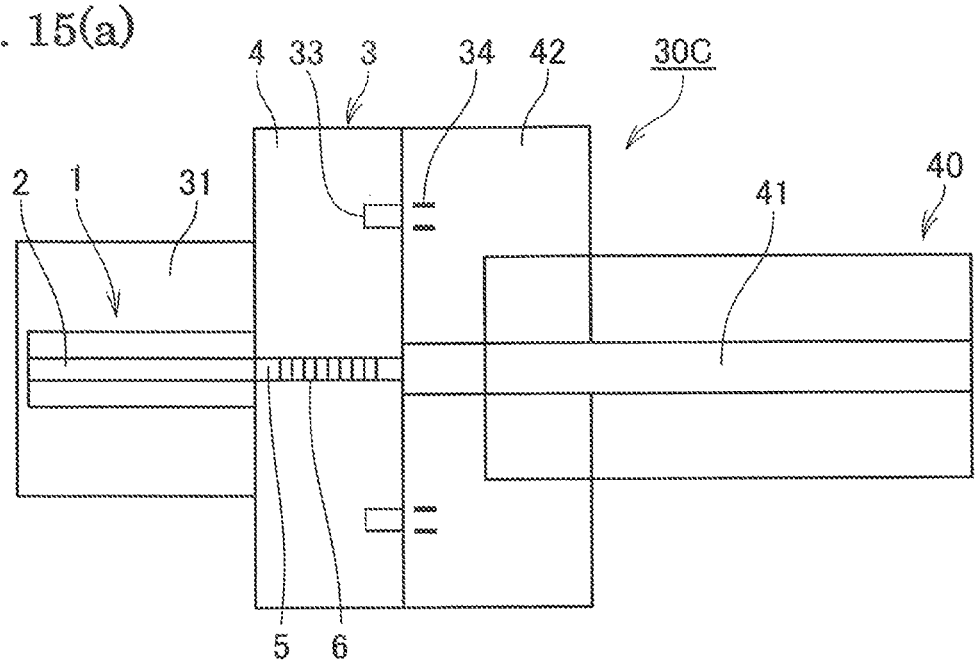
FIG. 15(a) is a plan view schematically showing an optical device of a preferred example.
Figure 15B:
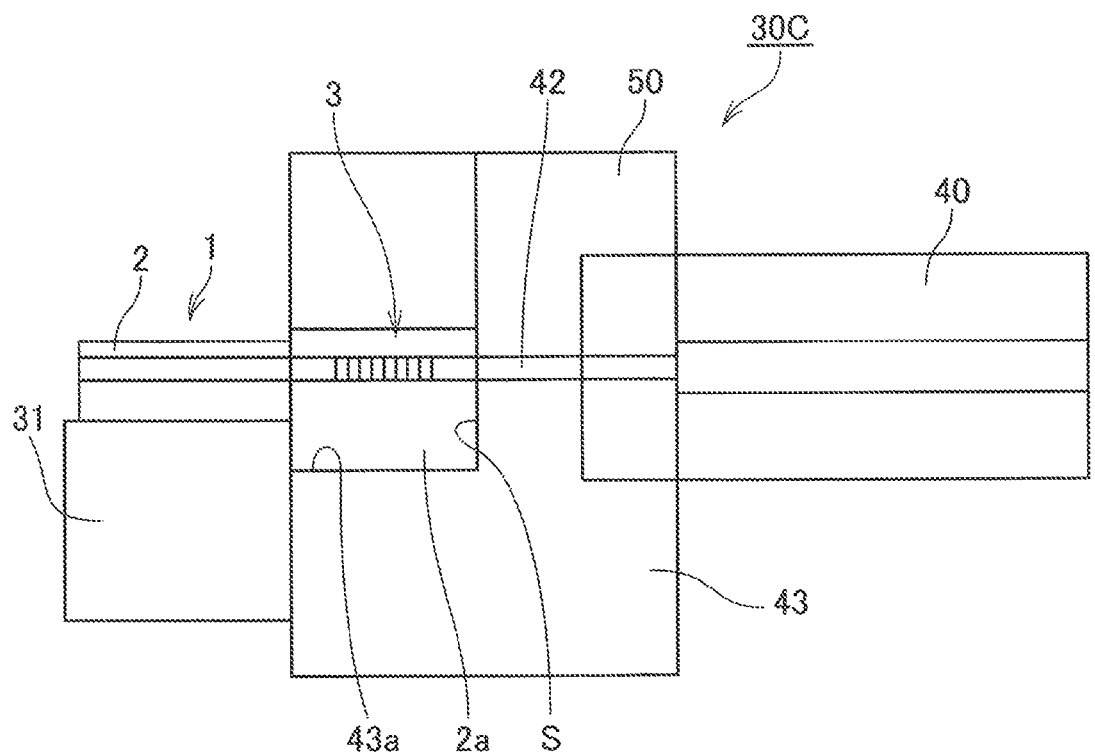
FIG. 15(b) is a side view schematically showing the optical device.

FIG. 15(a) is a plan view showing, in a model form, another optical device 30C, and FIG. 15(b) is a side view of the optical device 30C. The light source 1 is mounted on the mounting substrate 31. Moreover, an optical transmission element 40 is mounted on a separate mounting substrate 43. An optical fiber 41 is fixed to the optical transmission element 40 in this example. Further, a step part S and a mounting surface 43a are formed on the mounting substrate 43 by processing, and the grating element 3 is mounted on the mounting surface 43a. An optical fiber 42 is subjected to the optical axis alignment with the ridge-type optical waveguide. An upper clad substrate 50 is further connected onto the mounting substrate 43. In addition, the mounting substrate 43 and the mounting substrate 31 are integrated by means of adhesion or soldering, etc.

In a preferred embodiment, the width of the substrate for mounting the optical transmission element thereon and the width of the grating element are the same. Thus, alignment can be made such that the external shape of the grating element is aligned with the external shape of the mounting substrate for mounting the optical transmission element thereon.

In a preferred embodiment, marking for performing alignment between the grating element and the optical transmission element is implemented. Namely, in FIGS. 13 to 15, markings 33 on the grating element side and markings 34 on the optical transmission element side are formed to position the respective markings to thereby perform alignment.

FIGS. 16 to 19 relate to a first embodiment of a manufacturing method according to the present invention.

Figure 16A:
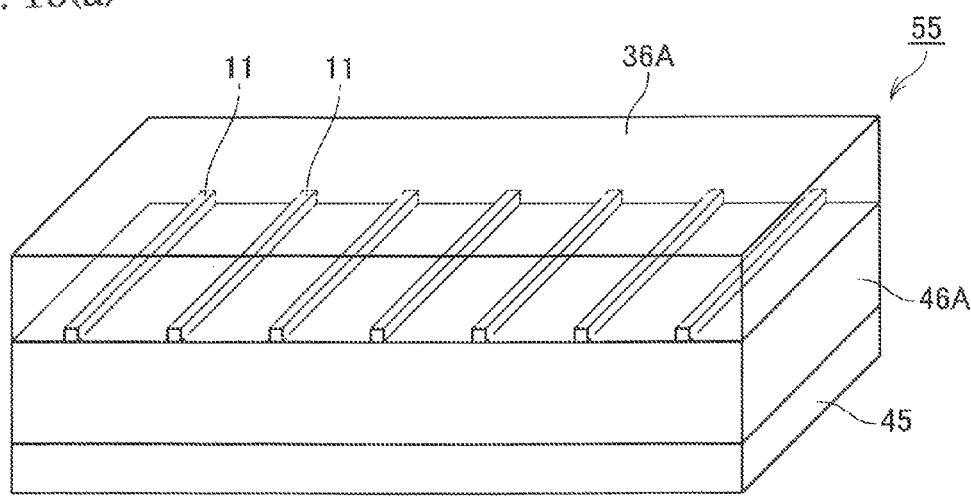
FIG. 16(a) shows a base member including a plurality of optical waveguides.

First, as shown in FIG. 16(a), a first base member 55 having a plurality of optical transmission parts 11 is produced. In this example, a substrate 46A is formed on a supporting substrate 45, and predetermined optical transmission parts 11 are formed on the substrate 46A. Moreover, in this example, the optical transmission parts 11 are covered by an upper side clad 36A. While a plurality of the optical transmission parts 11 are arranged in a row in FIG. 16(a), there may be adapted a wafer in which a plurality of optical transmission parts 11 are two-dimensionally arranged in a matrix.

Figure 16B:
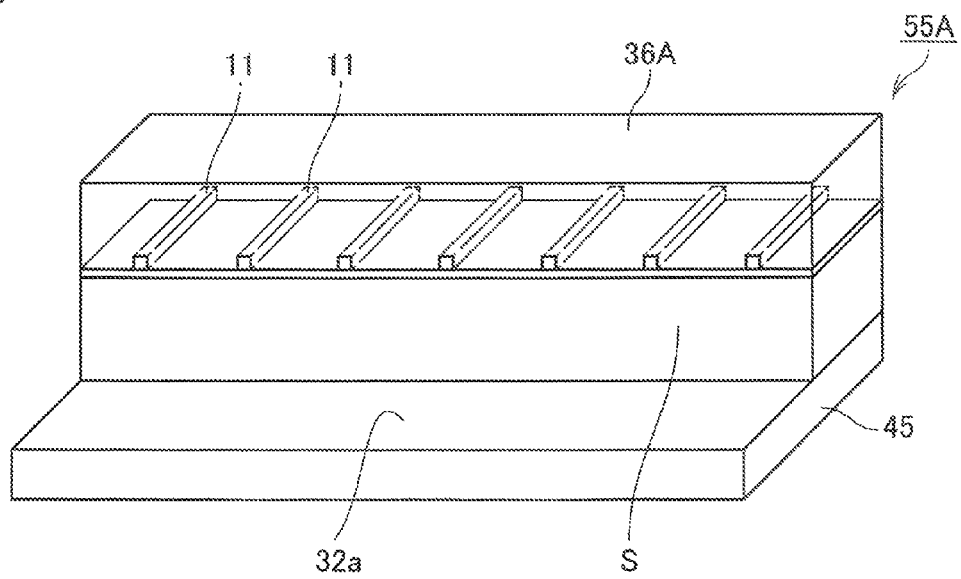
FIG. 16(b) shows the state where the base member has been processed.
Figure 17:
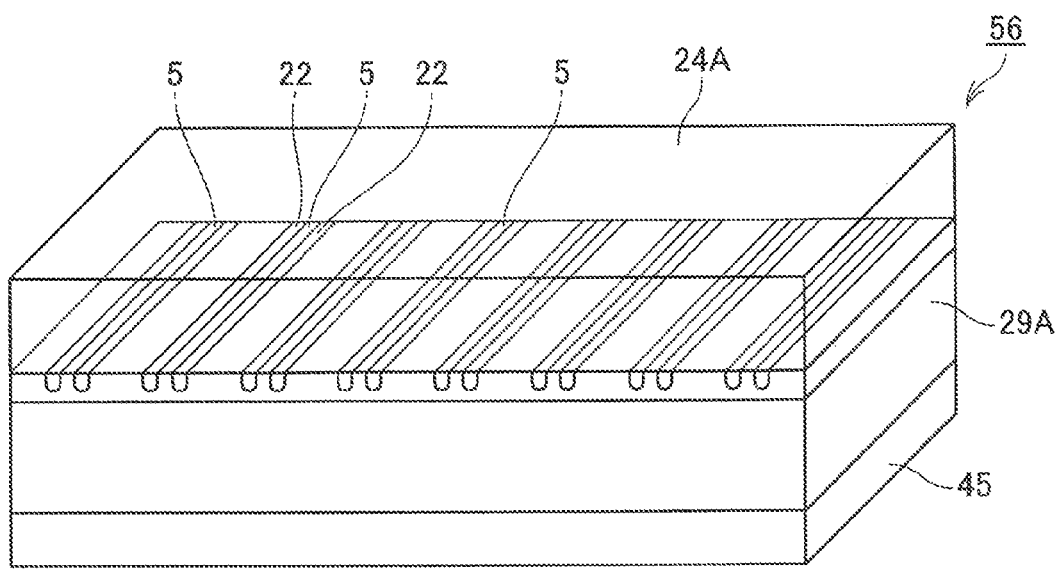
FIG. 17 shows a base member including a plurality of ridge-type optical waveguides and Bragg gratings.

By processing the first base member, there is formed a mounting surface for mounting a second base member. Namely, as shown in FIG. 16(b), by processing the base member, a step part S and a mounting surface 32a are formed in a base member 55A.

Further, a second base member having a plurality of ridge-type optical waveguides is produced. Namely, in the example shown in FIG. 17, a plurality of ridge-type optical waveguides 5 and ridge grooves 22 are formed on supporting substrate 29A. Predetermined Bragg gratings are formed in the ridge-type optical waveguide, respectively. Additionally, a plurality of ridge-type optical waveguides 5 is arranged in a row in the second base member in this example. Reference numeral 24A denotes an upper buffer layer.

Figure 18:
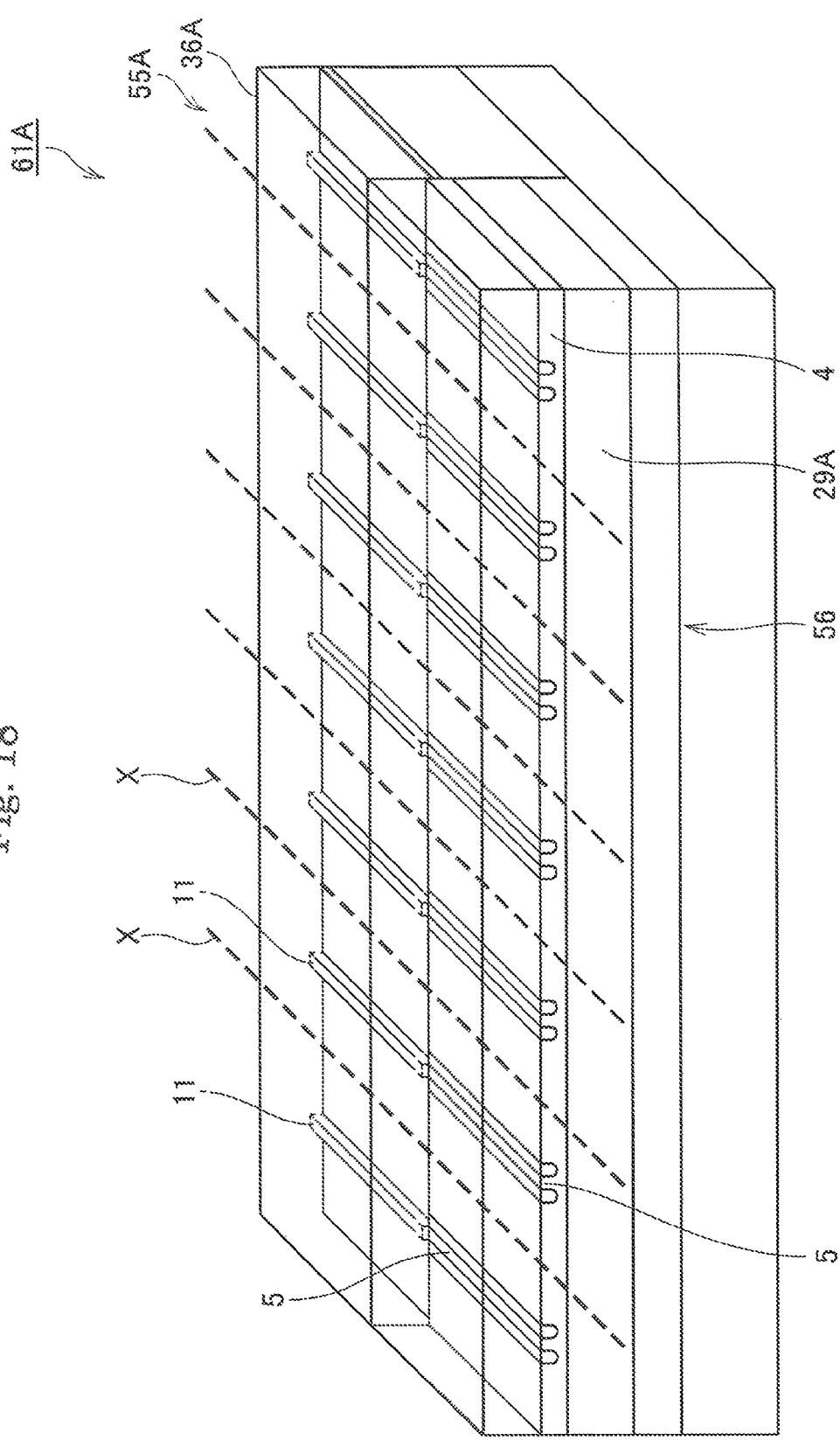
FIG. 18 shows the state of a composite body obtained by mounting a second base member onto a mounting surface of the first base member.
Figure 19:
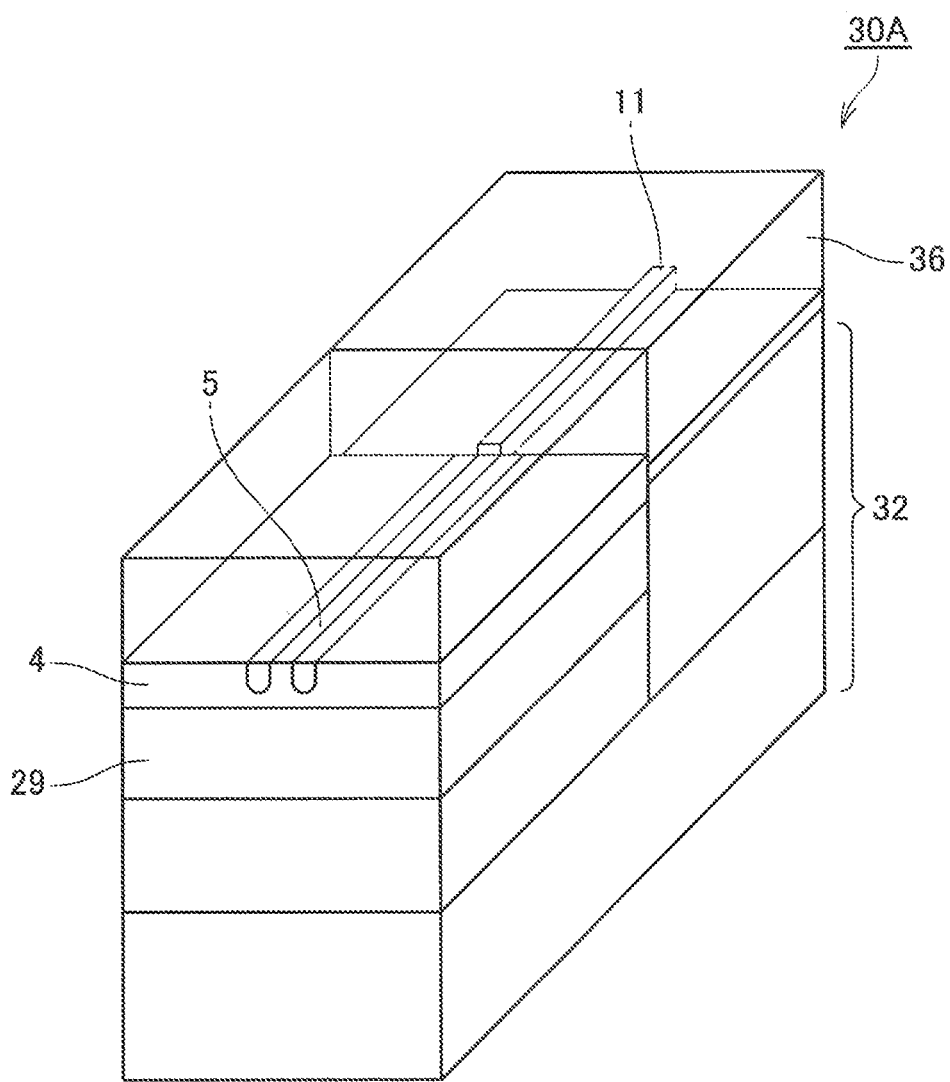
FIG. 19 shows an optical device chip obtained by cutting the composite body of FIG. 18.

Then, the second base member 56 is mounted on the mounting surface of the first base member 55A to provide a composite body 61A. Namely, as shown in FIG. 18, the second base member is accommodated in the step part of the first base member, and is mounted on the mounting surface so that the first and second base members are integrated. In this instance, the emitting surfaces of the ridge-type optical waveguides 5 are subjected to alignment with the incident surfaces of the optical transmission parts. The composite body obtained in this way is cut along dotted lines X. Thus, an optical device chip 30A as shown in FIG. 19 can be provided.

In this example, the ridge-type optical waveguides are one-dimensionally arranged in a row in the second base member 56. In the first base member 55A, the optical transmission parts are one-dimensionally arranged in a row. Alternatively, a plurality of the step parts and the mounting surfaces may be formed by processing in a single first base member 55A thereafter to mount the separate second base members 56 on the respective step parts and the respective mounting surfaces.

Figure 20A:
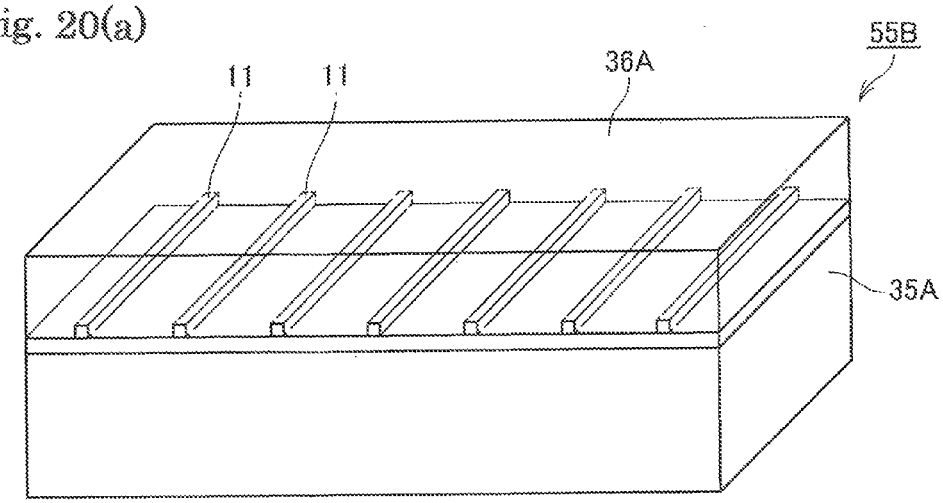
FIG. 20(a) is a perspective view schematically showing a base member including a plurality of the optical waveguides 11.
Figure 20B:
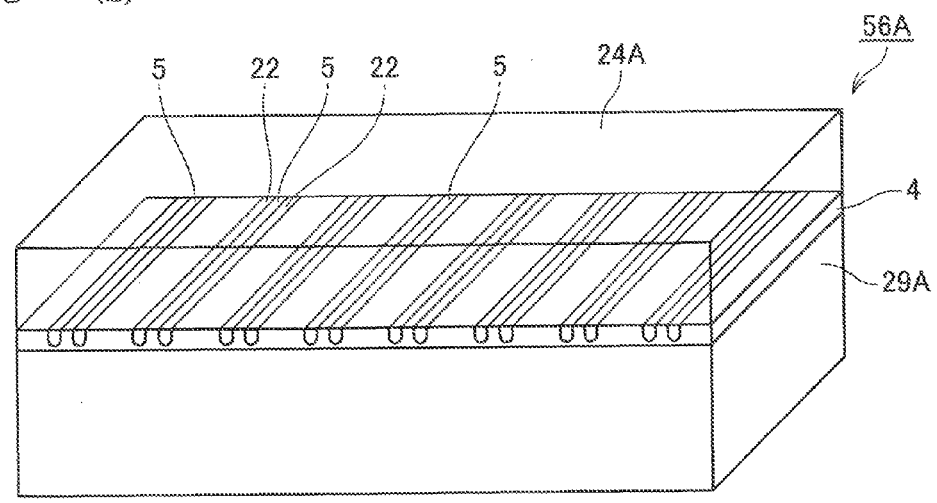
FIG. 20(b) is a perspective view schematically showing a base member including a plurality of the ridge-type optical waveguides 5.
Figure 21:
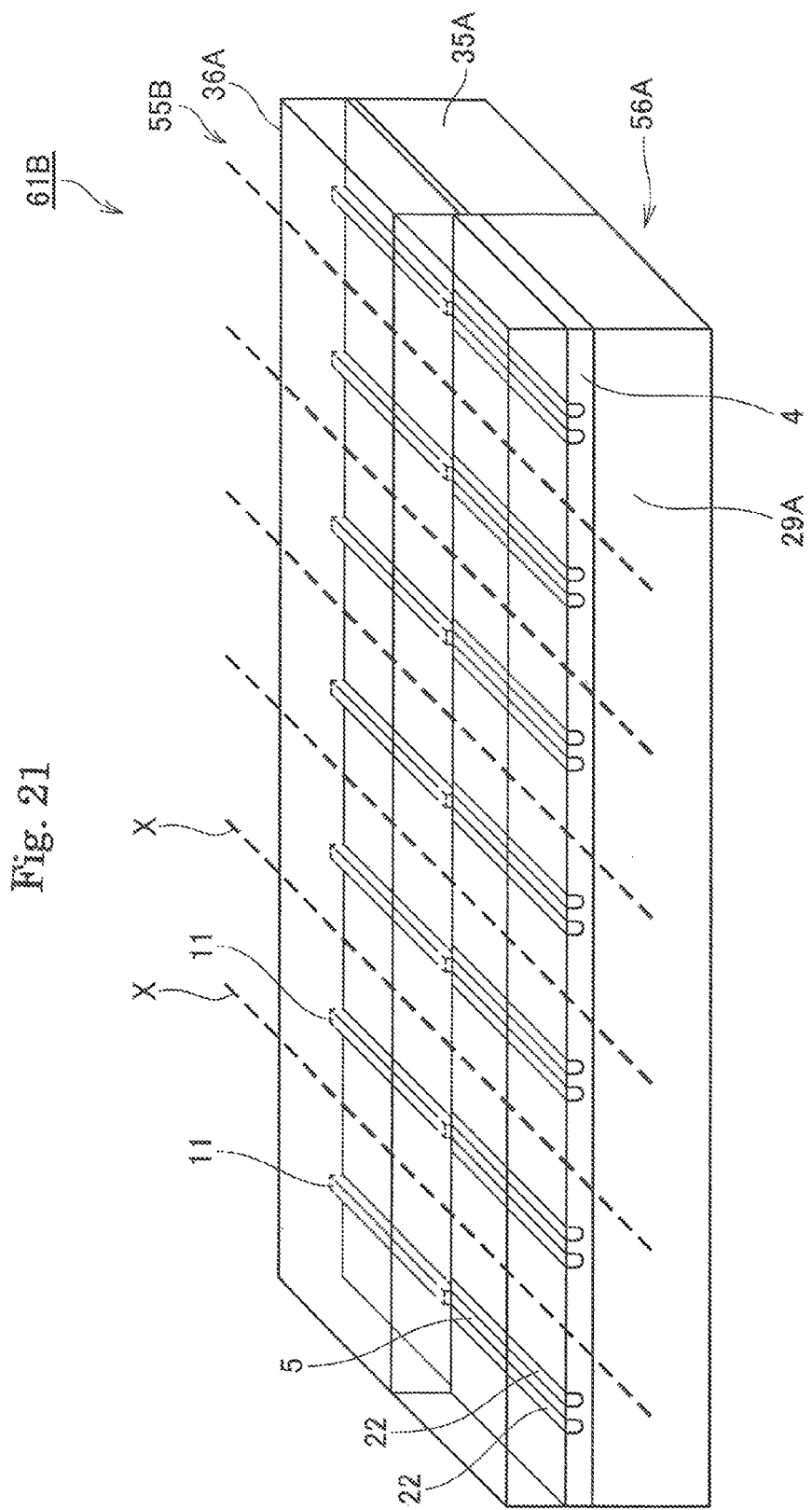
FIG. 21 is a perspective view showing a composite body obtained by coupling the base members.
Figure 22:
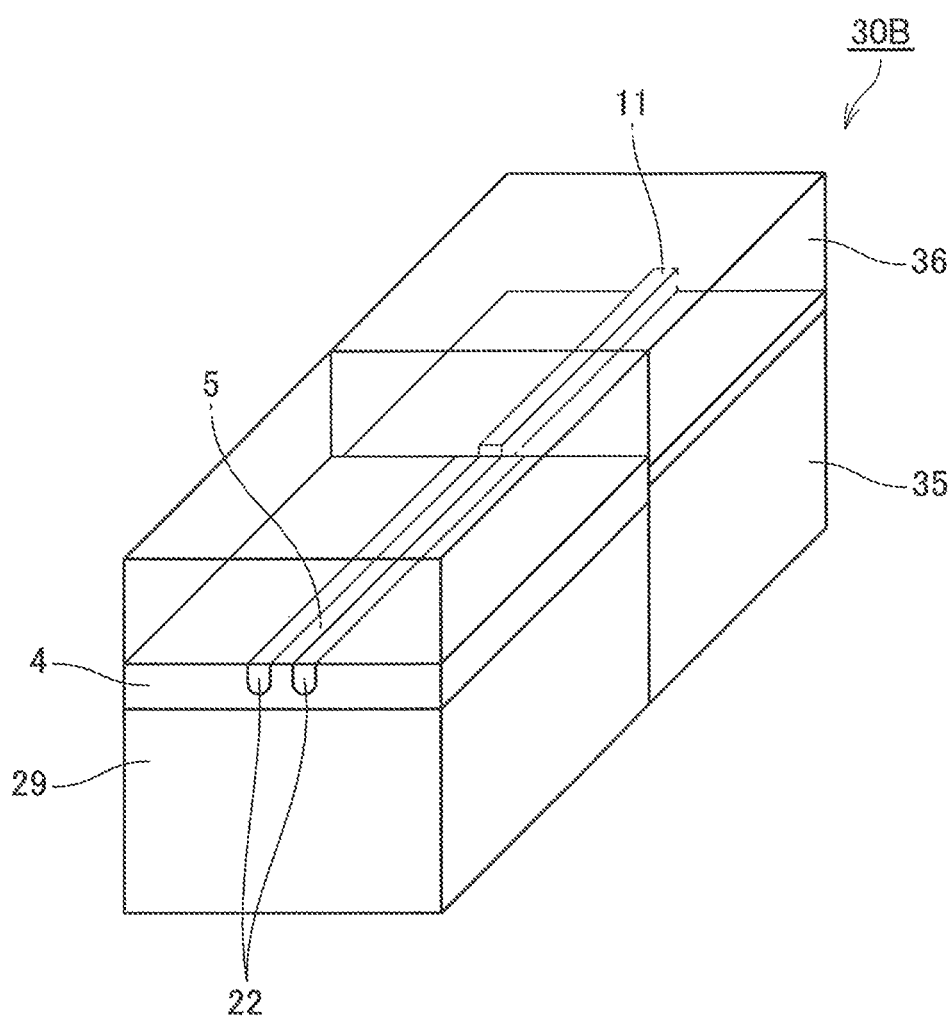
FIG. 22 shows an optical device chip obtained by cutting the composite body of FIG. 21.

FIGS. 20 to 22 relate to a second embodiment of the manufacturing method according to the present invention.

First, a first base member having a plurality of optical transmission parts is produced. Namely, as shown in FIG. 20(a), a first base member 55B having a plurality of optical transmission parts 11 is produced on a substrate 35A. At this time, a large number of optical transmission parts 11 are first two-dimensionally formed in a matrix on a wafer thereafter to cut the wafer, thereby providing a base member in which a plurality of optical transmission parts 11 are one-dimensionally arranged in a row. Reference numeral 36A denotes an upper buffer layer, wherein the upper buffer layer may not be provided.

Further, a second base member having a plurality of ridge-type optical waveguides is produced. Namely, as shown in FIG. 20(b), a plurality of ridge-type optical waveguides 5 are one-dimensionally arranged in a row on a supporting substrate 29A. At this time point, a large number of optical waveguides 5 are first two-dimensionally arranged in a base member thereafter to cut the wafer to thereby provide a base member 56A in which a plurality of optical waveguides 5 are one-dimensionally arranged in a row.

Then, the first base member and the second base member are connected with each other to provide a composite body. In this instance, the emitting surfaces of the ridge-type optical waveguides are subjected to alignment with the incident surfaces of the optical transmission parts. Namely, as shown in FIG. 21, the supporting substrate 35A of the first base member 55B and the supporting substrate 29A of the second base member 56A are connected with each other so that they are integrated with each other. At this time, alignment between the emitting surfaces of the ridge-type optical waveguides and the incident surfaces of the optical transmission parts is performed. Then, a composite body 61B is cut along the dotted lines X to thereby provide an optical devise chip 30B as shown in FIG. 22.

EXAMPLES

Example 1

An optical device described with reference to FIGS. 1 and 5 was manufactured. The cross sectional structure of the device is shown in FIG. 6(a).

Specifically, on a supporting substrate 29 made of quartz, by means of a sputtering apparatus, a lower buffer layer 20 made of $SiO_2$ was deposited in a thickness of 1 μm and an optical material layer 4 made of $Ta_2O_5$ in a thickness of 2 μm was deposited further. Then, Ti was deposited on the optical material layer 4 to produce a grating pattern by the photolithographic technique. Thereafter, a Bragg grating 6 having a pitch interval Λ of 205.4 nm and a length Lb of 25 μm was formed by the fluorine based reactive ion etching using Ti pattern as a mask. The groove depth td of the grating was set to 100 nm.

Then, a pattern of the optical waveguides was subjected to patterning by the photolithographic technique to form a ridge groove and a ridge-type optical waveguide by the reactive ion etching. The length Lm from the incident surface of the optical waveguide to the Bragg grating 6 was set to 25 μm. The depth of the ridge groove was 1.2 μm. Thereafter, an end surface was mirror-finished after cutting such that the element has a width of 1 mm and a length $L_{WG}$ of 100 μm. An AR coat of a single layer was formed on both end surfaces of the element.

Regarding the optical characteristics of the grating element, a super luminescent diode (SLD) as a broadband wavelength light source was used to input the light in the TE mode into the grating element to analyze the output light therefrom by means of an optical spectrum analyzer, thereby evaluating the reflection characteristics from the transmission characteristics. A reflection center wavelength of the measured element was 850 nm.

Then, a PPLN wavelength conversion element was produced as the optical waveguide element in a manner as described below.

Specifically, a periodic polarization-inverted structure was formed on MgO doped 5° off-cut y lithium niobate substrate. Thereafter, a lower buffer layer made of $SiO_2$ was formed as a film by a sputtering process on a surface of a periodic domain inverted lithium niobate substrate to bond onto a black LN substrate to provide a thickness of 1 μm by the precision polishing process. Next, in order to form an optical waveguide, Ti was deposited on $Ta_2O_5$ to produce a waveguide pattern by means of an electron-beam (EB) drawer. Thereafter, reactive ion etching was implemented by a method similar to the above in accordance with the fluorine based reactive ion etching with Ti pattern being as a mask to form the optical waveguide. Both sides of the etching groove were etched in such a manner to completely cut lithium niobate with the optical waveguide being left. The thickness of the optical waveguide was 1 μm. Finally, $SiO_2$ as an upper clad was deposited in a thickness of 2 μm by sputtering process so as to cover the optical waveguide.

In this case, respective parameters of the grating element and the wavelength conversion element are adopted as below.
Near-field diameter (horizontal direction) at the emitting surface of the light source active layer: 5.0 μm
Near-field diameter (horizontal direction) $B_{in}$ at the incident surface 5a: 2.9 μm
Optical waveguide width $W_{in}$ at the incident surface 5a of the optical waveguide: 3 μm
Optical waveguide width $W_{gr}$ at the grating 6: 3 μm
Optical waveguide width $W_{out}$ at the emitting surface 5b of the optical waveguide: 15 μm
Near-field diameter (horizontal direction) $B_{out}$ at the emitting surface 5b of the optical waveguide: 14.8 μm
Near-field diameter (vertical direction) at the emitting surface 5b of the optical waveguide: 1.9 μm
Near-field diameter (horizontal direction) $D_{in}$ at the incident surface 12 of the optical transmission part: 19 μm
Near-field diameter (vertical direction) at the incident surface 12 of the optical transmission part: 0.9 μm
Near-field diameter (horizontal direction) $D_{out}$ at the emitting surface of the optical transmission part: 2.9 μm In order to evaluate coupling efficiency based on the axial deviation between the grating element and the wavelength conversion element, the wavelength conversion element was separately cut to implement mirror-finishing to both end surfaces, thereby forming an AR coat thereon. Regarding the coupling efficiency, variations in the light amount were measured in horizontal and vertical directions at a wavelength of 850 nm by an alignment device.

As a result, the range where the coupling efficiency of 50% or more can be secured was ±4.5 μm in the horizontal direction, and was ±0.4 μm in the vertical direction.

Then, a laser module is mounted as shown in FIGS. 1 and 5. As a light source element, a general GaAs based laser was used.
Light Source Element Specification:
  Central wavelength: 847 nm
  Output: 50 mW
  Half value width: 0.1 nm
  Laser element length: 250 μm
Mounting Specification:
  Lg: 1 μm Driving was conducted under an automatic current control (ACC) without using a Peltire element after the module has been mounted. The laser module had the laser characteristics that oscillation took place at a central wavelength of 850 nm corresponding to the reflection wavelength of the grating, and an output thereof was 27 mW, which is slightly smaller than that in the case where the grating does not exist. Moreover, the temperature dependency of the laser oscillation wavelength and the power variations were measured in an operating temperature range from 20° C. to 40° C. As a result, the temperature coefficient of the oscillation wavelength was 0.05 nm/° C. In addition, the power variations of the output light from the waveguide element were ±1% or less.

Moreover, the fact that the tolerance for axial deviation is broad can suppress light quantity change even if the axis is deviated by temperature change to realize the light source module having small power variations.

Example 2

An optical device was manufactured in a manner similar to the example 1.
In this case, in the example 1, the following parameters were adopted.
Near-field diameter (horizontal direction) at the emitting surface of the optical active layer: 5.0 μm
Near-field diameter (horizontal direction) $B_{in}$ at the incident surface 5a: 2.9 μm
Optical waveguide width $W_{in}$ at the incident surface 5a of the optical waveguide: 3 μm
Optical waveguide width $W_{gr}$ at the grating 6: 3 μm
Optical waveguide width $W_{out}$ at the emitting surface 5b of the optical waveguide: 6 μm
Near-field diameter (horizontal direction) $B_{out}$ at the emitting surface 5b of the optical waveguide: 5.8 μm
Near-field diameter (vertical direction) at the emitting surface 5b of the optical waveguide: 1.9 μm
Near-field diameter (horizontal direction) $D_{in}$ at the incident surface 12 of the optical transmission part: 9 μm
Near-field diameter (vertical direction) at the incident surface 12 of the optical transmission part: 0.9 μm
Near-field diameter (horizontal direction) $D_{out}$ at the emitting surface of the optical transmission part: 2.9 μm In a manner similar to the example 1, light quantity variations were measured in horizontal and vertical directions at a wavelength of 850 nm by means of the alignment device.

As a result, the region where the coupling efficiency of 50% or more can be secured was ±2 μm in the horizontal direction, and was ±0.3 μm in the vertical direction.

Next, similarly to the example 1, driving is conducted under the automatic current control (ACC) without using a Peltier element after the module has been mounted. The laser module had the laser characteristics that oscillation took place at a central wavelength of 850 nm corresponding to the reflection wavelength of the grating, and an output thereof was 25 mW, which is smaller than that in the case where the grating element does not exist. Moreover, the temperature dependency of the laser oscillating wavelength and the power variations were measured in the operating temperature range from 20° C. to 40° C. As a result, the temperature coefficient of the oscillating wavelength was 0.05 nm/° C. In addition, the power variations of the output light from the waveguide element were ±3% or less.

Comparative Example 1

In a manner similar to the example 1, an optical device was manufactured.
In this case, the following parameters were adopted in the example 1.
Near-field diameter (horizontal direction) at the emitting surface of the light source active layer: 5.0 μm
Near-field diameter (horizontal direction) $B_{in}$ at the incident surface 5a: 2.9 μm
Optical waveguide width $W_{in}$ at the incident surface 5a of the optical waveguide: 3 μm Optical waveguide width $W_{gr}$ at the grating 6: 3 μm
Optical waveguide width $W_{out}$ at the emitting surface 5b of the optical waveguide: 3 μm
Near-field diameter (horizontal direction) $B_{out}$ at the emitting surface 5b of the optical waveguide: 2.9 μm
Near-field diameter (vertical direction) at the emitting surface 5b of the optical waveguide: 1.9 μm
Near-field diameter (horizontal direction) $D_{in}$ at the incident surface 12 of the optical transmission part: 1.9 μm
Near-field diameter (vertical direction) at the incident surface 12 of the optical transmission part: 0.9 μm
Near-field diameter (horizontal direction) $D_{out}$ at the emitting surface of the optical transmission part: 2.9 μm In a manner similar to the example 1, the variations in light amount were measured in horizontal and vertical directions at a wavelength of 850 nm by means of the alignment device.

As a result, the region where the coupling efficiency of 50% or more can be secured was ±1 μm in the horizontal direction, and was ±0.3 μm in the vertical direction.

Next, similarly to the example 1, driving was conducted by the automatic current control (ACC) without using a Peltier element after the module has been mounted. The laser module had the laser characteristics that oscillation took place at a central wavelength of 850 nm corresponding to the reflection wavelength of the grating, and the output thereof was 30 mW. Moreover, the temperature dependency of the laser oscillation wavelength and the power variations were measured in the operating temperature range from 20° C. and 40° C. As a result, the temperature coefficient of the oscillation wavelength was 0.05 nm/° C. In addition, the power variations of the output light from the waveguide element were ±10% or less.

Example 3

In a manner similar to the example 1, an optical device was manufactured.

In this case, the following parameters were adopted in the example 1.
Near-field diameter (horizontal direction) at the emitting surface of the optical active layer: 5.0 μm
Near-field diameter (horizontal direction) $B_{in}$ at the incident surface 5a: 2.9 μm
Optical waveguide width $W_{in}$ at the incident surface 5a of the optical waveguide: 3 μm
Optical waveguide width $W_{gr}$ at the grating 6: 3 μm
Optical waveguide width $W_{out}$ at the emitting surface 5b of the optical waveguide: 20 μm
Near-field diameter (horizontal direction) $B_{out}$ at the emitting surface 5b of the optical waveguide: 18.5 μm
Near-field diameter (vertical direction) at the emitting surface 5b of the optical waveguide: 1.9 μm
Near-field diameter (horizontal direction) $D_{in}$ at the incident surface 12 of the optical transmission part: 14.7 μm
Near-field diameter (vertical direction) at the incident surface 12 of the optical transmission part: 0.9 μm
Near-field diameter (horizontal direction) $D_{out}$ at the emitting surface of the optical transmission part: 2.9 μm In a manner similar to the example 1, the variations in light amount were measured in horizontal and vertical directions at a wavelength of 850 nm by means of the alignment device.

As a result, the region where the coupling efficiency of 50% or more can be secured was ±4.5 μm in the horizontal direction, and was ±0.4 μm in the vertical direction.

Next, similarly to the example 1, driving was conducted under the automatic current control (ACC) without using a Peltier element after the module has been mounted. The laser module had the laser characteristics that oscillation took place at a central wavelength of 850 nm corresponding to the reflection wavelength of the grating, and an output thereof was 25 mW, which is smaller than that in the case where the grating element does not exist. Moreover, the temperature dependency of the laser oscillation wavelength and the power variations were measured in the operating temperature range from 20° C. to 40° C. As a result, the temperature coefficient of the oscillation wavelength was 0.05 nm/° C. In addition, the power variations of the output light from the waveguide element were ±1% or less.

Example 4

In a manner similar to the example 1, an optical device was manufactured.

In this case, the following parameters were adopted in the example 1.
Near-field diameter (horizontal direction) at the emitting surface of the light source active layer: 5.0 μm
Near-field diameter (horizontal direction) $B_{in}$ at the incident surface 5a: 2.9 μm
Optical waveguide width $W_{in}$ at the incident surface 5a of the optical waveguide: 3 μm
Optical waveguide width $W_{gr}$ at the grating 6: 3 μm
Optical waveguide width $W_{out}$ at the emitting surface 5b of the optical waveguide: 3 μm
Near-field diameter (horizontal direction) $B_{out}$ at the emitting surface 5b of the optical waveguide: 2.9 μm
Near-field diameter (vertical direction) at the emitting surface 5b of the optical waveguide: 1.9 μm
Near-field diameter (horizontal direction) $D_{in}$ at the incident surface 12 of the optical transmission part: 6.5 μm
Near-field diameter (vertical direction) at the incident surface 12 of the optical transmission part: 0.9 μm
Near-field diameter (horizontal direction) $D_{out}$ at the emitting surface of the optical transmission part: 2.9 μm In a manner similar to the example 1, the variations in light amount were measured in horizontal and vertical directions at a wavelength of 850 nm by means of the alignment device.

As a result, the region where the coupling efficiency of 50% or more can be secured was ±1.3 μm in the horizontal direction, and was ±0.3 μm in the vertical direction.

Next, similarly to the example 1, driving is conducted under the automatic current control (ACC) without using a Peltier element after the module has been mounted. The laser module had the laser characteristics that oscillation took place at a central wavelength of 850 nm corresponding to the reflection wavelength of the grating, and an output thereof was 25 mW, which is smaller than that in the case where the grating element does not exist. Moreover, the temperature dependency of the laser oscillating wavelength and the power variations were measured in the operating temperature range from 20° C. to 40° C. As a result, the temperature coefficient of the oscillation wavelength was 0.05 nm/° C. In addition, the power variations of the output light from the waveguide element were ±6% or less.

Example 5

In a manner similar to the example 1, an optical device was manufactured.

In this case, the following parameters were adopted in the example 1.

Near-field diameter (horizontal direction) at the emitting surface of the light source active layer: 5.0 μm
Near-field diameter (horizontal direction) $B_{in}$ at the incident surface 5a: 6.5 μm
Optical waveguide width $W_{in}$ at the incident surface 5a of the optical waveguide: 7 μm
Optical waveguide width $W_{gr}$ at the grating 6: 3 μm
Optical waveguide width $W_{out}$ at the emitting surface 5b of the optical waveguide: 6 μm
Near-field diameter (horizontal direction) $B_{out}$ at the emitting surface 5b of the optical waveguide: 5.8 μm
Near-field diameter (vertical direction) at the emitting surface 5b of the optical waveguide: 1.9 μm
Near-field diameter (horizontal direction) $D_{in}$ at the incident surface 12 of the optical transmission part: 3 μm
Near-field diameter (vertical direction) at the incident surface 12 of the optical transmission part: 0.9 μm
Near-field diameter (horizontal direction) $D_{out}$ at the emitting surface of the optical transmission part: 2.9 μm In a manner similar to the example 1, the variations in light amount were measured in horizontal and vertical directions at a wavelength of 850 nm by means of the alignment device.

As a result, the region where the coupling efficiency of 50% or more can be secured was ±2 μm in the horizontal direction, and ±0.3 m in the vertical direction on the light source side and the optical transmission side of the grating element.

Next, similarly to the example 1, when driving was conducted under the automatic current control (ACC) without using a Peltier element after the module has been mounted. The laser module had the laser characteristics that oscillation took place at a central wavelength of 850 nm corresponding to the reflection wavelength of the grating, and an output thereof was 25 mW, which is smaller than that in the case where the grating element does not exist. Moreover, the temperature dependency of the laser oscillation wavelength and the power variations were measured in the operating temperature range from 20° C. to 40° C. As a result, the temperature coefficient of the oscillation wavelength was 0.05 nm/° C. In addition, the power variations of the output light from the waveguide element were ±1% or less.

The invention claimed is:

1. An optical device comprising a semiconductor laser light source, a grating element and an optical transmission element:
    wherein said grating element comprises a ridge-type optical waveguide having an incident surface to which a semiconductor laser light is incident and an emitting surface from which an outgoing light having a desired wavelength is emitted, and a Bragg grating formed in said ridge-type optical waveguide;
    wherein said light transmission element comprises an optical transmission part having an incident surface to which said outgoing light from the ridge-type optical waveguide is incident; and
    wherein a near-field diameter in a horizontal direction at said incident surface of said optical transmission part is greater than a near-field diameter in said horizontal direction at said emitting surface of said ridge-type optical waveguide.

2. The device of claim 1,
    wherein said ridge-type optical waveguide comprises an emitting side propagation part between said Bragg grating and said emitting surface, and
    wherein a width at said emitting surface of said ridge-type optical waveguide is greater than a width of said ridge-type optical waveguide in said Bragg grating.

3. The device of claim 1,
    wherein a wavelength at said emitting surface of said ridge-type optical waveguide is 1 μm or less and said near-field diameter in said horizontal direction at said incident surface of said optical transmission part is 10 μm or more.

4. An optical device comprising a semiconductor laser light source, a grating element and an optical transmission element:
    wherein said grating element comprises a ridge-type optical waveguide having an incident surface to which a semiconductor laser light is incident and an emitting surface from which an outgoing light having a desired wavelength is emitted, and a Bragg grating formed in said ridge-type optical waveguide;
    wherein said optical transmission element comprises an optical transmission part having an incident surface to which said outgoing light from said ridge-type optical waveguide is incident; and
    wherein said ridge-type optical waveguide comprises an emitting side propagation part between said Bragg grating and said emitting surface, and a width at said emitting surface of said ridge-type optical waveguide is greater than a width of said ridge-type optical waveguide in said Bragg grating.

5. The device of claim 4, wherein a wavelength at said emitting surface of said ridge-type optical waveguide is 1 μm or less, and
    wherein a near-field diameter in a horizontal direction at said emitting surface of said ridge-type optical waveguide is 10 μm or more.

6. The device of claim 4, wherein a near-field diameter in said horizontal direction at said incident surface of said optical transmission part is greater than said near-field diameter in said horizontal direction at said emitting surface of said ridge-type optical waveguide.

7. The device of claim 1, wherein a near-field diameter in a vertical direction at said emitting surface of said ridge-type optical waveguide is different from a near-field diameter in said vertical direction at said incident surface of said optical transmission part.

8. The device of claim 1, comprising a common substrate for mounting said grating element and said optical transmission element.

9. The device of claim 1, comprising a substrate for mounting said grating element thereon and a substrate for mounting said optical transmission element thereon.

10. The device of claim 8, wherein a width of said substrate for mounting said optical transmission element thereon and a width of said grating element are the same.

11. The device of claim 1, wherein a near-field diameter in said horizontal direction at said incident surface of said ridge-type optical waveguide is greater than a near-field diameter in said horizontal direction at an emitting surface of said light source.

12. The device of claim 1, wherein a ridge width $W_{in}$ in said horizontal direction at said incident surface of said ridge-type optical waveguide is greater than a near-field diameter in said horizontal direction at an emitting surface of said light source.

13. The device of claim 1, further comprising a marking for performing alignment between said grating element and said optical transmission element.

14. A method of manufacturing an optical device comprising a semiconductor laser light source, a grating element and an optical transmission element:
wherein said grating element comprises a ridge-type optical waveguide having an incident surface to which a semiconductor laser light is incident and an emitting surface from which an outgoing light having a desired wavelength is emitted, and a Bragg grating formed in said ridge-type optical waveguide; and
wherein said optical transmission element comprises an optical transmission part having an incident surface to which an outgoing light from said ridge-type optical waveguide is incident;
the method comprising the steps of:
producing a first base member having a plurality of said optical transmission parts;
producing a second base member having a plurality of said ridge-type optical waveguides;
processing said first base member to form a mounting surface for mounting said second base member thereon;
mounting said second base member onto said mounting surface to obtain a composite body such that said emitting surfaces of said ridge-type optical waveguides are aligned with said incident surfaces of the optical transmission parts, respectively; and
cutting said composite body to obtain said optical device.

15. A method of manufacturing an optical device comprising a semiconductor laser light source, a grating element and an optical transmission element:
wherein said grating element comprises a ridge-type optical waveguide having an incident surface to which a semiconductor laser light is incident and an emitting surface from which an outgoing light having a desired wavelength is emitted, and a Bragg grating formed in said ridge-type optical waveguide; and
wherein said optical transmission element comprises an optical transmission part having an incident surface to which an outgoing light from said ridge-type optical waveguide is incident;
the method comprising the steps of:
producing a first base member having a plurality of said light transmission parts;
producing a second base member having a plurality of said ridge-type optical waveguides;
bonding said first base member and the second base member to obtain a composite body such that said emitting surfaces of said ridge-type optical waveguides are aligned with said incident surfaces of said optical transmission parts, respectively; and
cutting said composite body to obtain said optical device.

* * * * *